(12) United States Patent
Mahmoud et al.

(10) Patent No.: US 11,682,695 B2
(45) Date of Patent: Jun. 20, 2023

(54) SEMICONDUCTOR DEVICE HAVING A HIGH BREAKDOWN VOLTAGE

(71) Applicant: Infineon Technologies Dresden GmbH & Co. KG, Dresden (DE)

(72) Inventors: Ahmed Mahmoud, Freising (DE); Franz Hirler, Isen (DE); Marco Mueller, Pirna (DE); Rolf Weis, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 38 days.

(21) Appl. No.: 17/331,010

(22) Filed: May 26, 2021

(65) Prior Publication Data
US 2021/0376065 A1  Dec. 2, 2021

(30) Foreign Application Priority Data
May 28, 2020  (EP) ...................................... 20177170

(51) Int. Cl.
*H01L 29/06* (2006.01)
*H01L 29/10* (2006.01)
(Continued)

(52) U.S. Cl.
CPC ...... *H01L 29/0634* (2013.01); *H01L 29/1095* (2013.01); *H01L 29/404* (2013.01); *H01L 29/7395* (2013.01)

(58) Field of Classification Search
CPC ............. H01L 29/0634; H01L 29/1095; H01L 29/404; H01L 29/7395; H01L 29/0615;
(Continued)

(56) References Cited

U.S. PATENT DOCUMENTS

2011/0127606 A1  6/2011  Bobde et al.
2015/0102404 A1*  4/2015  Meiser ................ H01L 29/1095
257/334
(Continued)

FOREIGN PATENT DOCUMENTS

EP  3644374 A1  4/2020

*Primary Examiner* — Mohammad M Hoque
(74) *Attorney, Agent, or Firm* — Murphy, Bilak & Homiller, PLLC

(57) ABSTRACT

A semiconductor device includes a layer stack with first semiconductor layers and second semiconductor layers of opposite doping types arranged alternatingly. A first semiconductor region of a first semiconductor device adjoins the first semiconductor layers, and has a first end arranged in a first region of the first semiconductor device and extends from the first end into a second region of the first semiconductor device. Second semiconductor regions of the first semiconductor device adjoin at least one of the second semiconductor layers. A third semiconductor region of the first semiconductor device adjoins the first semiconductor layers. The first semiconductor region extends from the first region into the second region and is spaced apart from the third semiconductor region. The second semiconductor regions are arranged between, and spaced apart from, the third and first semiconductor regions. An average doping concentration along a shortest path between the first and third semiconductor regions in at least one of the first or second semiconductor layers in the first region differs from an average doping concentration along a shortest path between the first and third semiconductor regions of the same layer in the second region.

15 Claims, 11 Drawing Sheets

(51) Int. Cl.
*H01L 29/40* (2006.01)
*H01L 29/739* (2006.01)

(58) Field of Classification Search
CPC ............... H01L 29/0696; H01L 27/085; H01L 29/0692; H01L 29/1066; H01L 29/66901; H01L 29/808
USPC ........................................................ 257/341
See application file for complete search history.

(56) References Cited

U.S. PATENT DOCUMENTS

| | | |
|---|---|---|
| 2017/0222043 A1 | 8/2017 | Hirler et al. |
| 2019/0198609 A1 | 6/2019 | Weis et al. |
| 2019/0287804 A1 | 9/2019 | Weis et al. |

* cited by examiner

SEMICONDUCTOR DEVICE HAVING A HIGH BREAKDOWN VOLTAGE

TECHNICAL FIELD

This disclosure in general relates to a semiconductor device, in particular a semiconductor device with a transistor arrangement.

BACKGROUND

Usually, transistor arrangements include a plurality of transistor devices formed in a semiconductor body. A superjunction transistor device, for example, usually includes at least one drift region of a first doping type (conductivity type) and a compensation region of a second doping type (conductivity type) complementary to the first doping type. The drift region and the compensation region are connected such that in an on-state (switched on state) of the transistor device a current can flow in the drift region, while in the off-state (switched off state) a depletion region expands in the drift region and the compensation region that prevents a current flow through the drift region. A transistor arrangement including a plurality of superjunction transistor devices, therefore, includes a plurality of drift regions and compensation regions. The drift regions and compensation regions of a transistor arrangement may be implemented as a layer stack with a plurality of first semiconductor layers of the first doping type and a plurality of second semiconductor layers of the second doping type.

It is desirable to provide a semiconductor device that has a high breakdown voltage, and to provide a method for producing the same.

SUMMARY

One example relates to a semiconductor device including a layer stack with a plurality of first semiconductor layers of a first doping type and a plurality of second semiconductor layers of a second doping type complementary to the first doping type, wherein the first semiconductor layers and the second semiconductor layers are arranged alternatingly between a first surface and a second surface of the layer stack. The device further includes a first semiconductor region of a first semiconductor device adjoining the plurality of first semiconductor layers, wherein the first semiconductor region has a first end arranged in a first region of the semiconductor device and extends from its first end and from the first region in a first horizontal direction into a second region of the semiconductor device. The device further comprises a plurality of second semiconductor regions of the first semiconductor device, wherein each of the plurality of semiconductor regions adjoins at least one of the plurality of second semiconductor layers, and wherein a first number of the plurality of second semiconductor regions is arranged in the first region and a second number of the plurality of second semiconductor regions is arranged in the second region of the semiconductor device. The device further includes a third semiconductor region of the first semiconductor device, adjoining the plurality of first semiconductor layers, wherein the first semiconductor region extends from the first region into the second region of the semiconductor device and is spaced apart from the third semiconductor region, and the plurality of second semiconductor regions is arranged between the third semiconductor region and the first semiconductor region, and is spaced apart from the third semiconductor region and the first semiconductor region. An average doping concentration along a shortest path between the first semiconductor region and the third semiconductor region in either at least one of the first semiconductor layers, or in at least one of the second semiconductor layers in the first region differs from an average doping concentration along a shortest path between the first semiconductor region and the third semiconductor region of the same layer in the second region.

Another example relates to a method for producing a semiconductor device. The method includes forming a layer stack with a plurality of first semiconductor layers of a first doping type and a plurality of second semiconductor layers of a second doping type complementary to the first doping type, wherein the first semiconductor layers and the second semiconductor layers are arranged alternatingly between a first surface and a second surface of the layer stack, forming a first semiconductor region of a first semiconductor device adjoining the plurality of first semiconductor layers, wherein the first semiconductor region has a first end arranged in a first region of the semiconductor device and extends from its first end and from the first region in a first horizontal direction into a second region of the semiconductor device, forming a plurality of second semiconductor regions of the first semiconductor device, wherein each of the plurality of semiconductor regions adjoins at least one of the plurality of second semiconductor layers, and wherein a first number of the plurality of second semiconductor regions is arranged in the first region and a second number of the plurality of second semiconductor regions is arranged in the second region of the semiconductor device, and forming a third semiconductor region of the first semiconductor device, adjoining the plurality of first semiconductor layers, wherein the first semiconductor region extends from the first region into the second region of the semiconductor device and is spaced apart from the third semiconductor region, and the plurality of second semiconductor regions is arranged between the third semiconductor region and the first semiconductor region, and is spaced apart from the third semiconductor region and the first semiconductor region. An average doping concentration along a shortest path between the first semiconductor region and the third semiconductor region in either at least one of the first semiconductor layers, or in at least one of the second semiconductor layers in the first region differs from an average doping concentration along a shortest path between the first semiconductor region and the third semiconductor region of the same layer in the second region.

An even further example relates to a semiconductor device including a layer stack with a plurality of first semiconductor layers of a first doping type and a plurality of second semiconductor layers of a second doping type complementary to the first doping type, wherein the first semiconductor layers and the second semiconductor layers are arranged alternatingly between a first surface and a second surface of the layer stack, a first semiconductor region of a first semiconductor device adjoining the plurality of first semiconductor layers, wherein the first semiconductor region has a first end arranged in a first region of the semiconductor device and extends from its first end and from the first region in a first horizontal direction into a second region of the semiconductor device, and a plurality of second semiconductor regions of the first semiconductor device, wherein each of the plurality of semiconductor regions adjoins at least one of the plurality of second semiconductor layers, and wherein a first number of the plurality of second semiconductor regions is arranged in the first region and a second number of the plurality of second semiconductor regions is arranged in the second region of the semiconductor device. The device further includes a third semiconductor region of the first semiconductor device, adjoining the plurality of first semiconductor layers, wherein the first semiconductor region extends from the first region into the second region of the semiconductor device and is spaced apart from the third semiconductor region, and the plurality of second semiconductor regions is arranged between the third semiconductor region and the first semiconductor region, and is spaced apart from the third semiconductor region and the first semiconductor region. The device further includes a carrier, wherein the second surface of the layer stack adjoins the carrier, and at least one of a first carrier region of the second doping type, extending from the second surface of the layer stack into the carrier, wherein the first carrier region is arranged adjacent to the first semiconductor region and the plurality of second semiconductor regions, and a second carrier region of the first doping type, extending from the second surface of the layer stack into the carrier, wherein the second carrier region is arranged adjacent to the third semiconductor region, wherein the first carrier region, in a horizontal direction, extends from the first semiconductor region towards the third semiconductor region, and in the first region of the semiconductor device, a width of the first carrier region is greater than a width of the first carrier region in the second region of the semiconductor device, wherein a width of the first carrier region corresponds to an extension of the first carrier region from the first semiconductor region towards the third semiconductor region.

An even further example relates to a semiconductor device including a layer stack with a plurality of first semiconductor layers of a first doping type and a plurality of second semiconductor layers of a second doping type complementary to the first doping type, wherein the first semiconductor layers and the second semiconductor layers are arranged alternatingly between a first surface and a second surface of the layer stack, a first semiconductor region of a first semiconductor device adjoining the plurality of first semiconductor layers, wherein the first semiconductor region has a first end arranged in a first region of the semiconductor device and extends from its first end and from the first region in a first horizontal direction into a second region of the semiconductor device, a plurality of second semiconductor regions of the first semiconductor device, wherein each of the plurality of semiconductor regions adjoins at least one of the plurality of second semiconductor layers, and wherein a first number of the plurality of second semiconductor regions is arranged in the first region and a second number of the plurality of second semiconductor regions is arranged in the second region of the semiconductor device, and a third semiconductor region of the first semiconductor device, adjoining the plurality of first semiconductor layers, wherein the first semiconductor region extends from the first region into the second region of the semiconductor device and is spaced apart from the third semiconductor region, and the plurality of second semiconductor regions is arranged between the third semiconductor region and the first semiconductor region, and is spaced apart from the third semiconductor region and the first semiconductor region. The device further includes a third semiconductor layer, wherein the first surface of the layer stack adjoins the third semiconductor layer, and at least one of a first field plate region comprising a conducting material, arranged above to the third semiconductor layer such that the third semiconductor layer is arranged between the first field plate region and the layer stack, and a second field plate region comprising a conducting material, arranged adjacent to the third semiconductor layer such that the third semiconductor layer is arranged between the second field plate region and the layer stack, wherein the first field plate region, in a horizontal direction, extends from the first semiconductor region towards the third semiconductor region, and in the first region of the semiconductor device, a width of the first field plate region is greater than a width of the first field plate region in the second region of the semiconductor device, wherein a width of the first field plate region corresponds to an extension of the first field plate region from the first semiconductor region towards the third semiconductor region.

Examples are explained below with reference to the drawings. The drawings serve to illustrate certain principles, so that only aspects necessary for understanding these principles are illustrated. The drawings are not to scale. In the drawings the same reference characters denote like features.

BRIEF DESCRIPTION OF THE DRAWINGS

FIGS. 2A-2D show equivalent circuit diagrams that illustrate how the first transistor device and the second transistor device in a transistor arrangement of the type shown in FIGS. 1A-1C may be connected;

FIGS. 23A-3D illustrate an example of a method for forming a transistor arrangement.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1A:
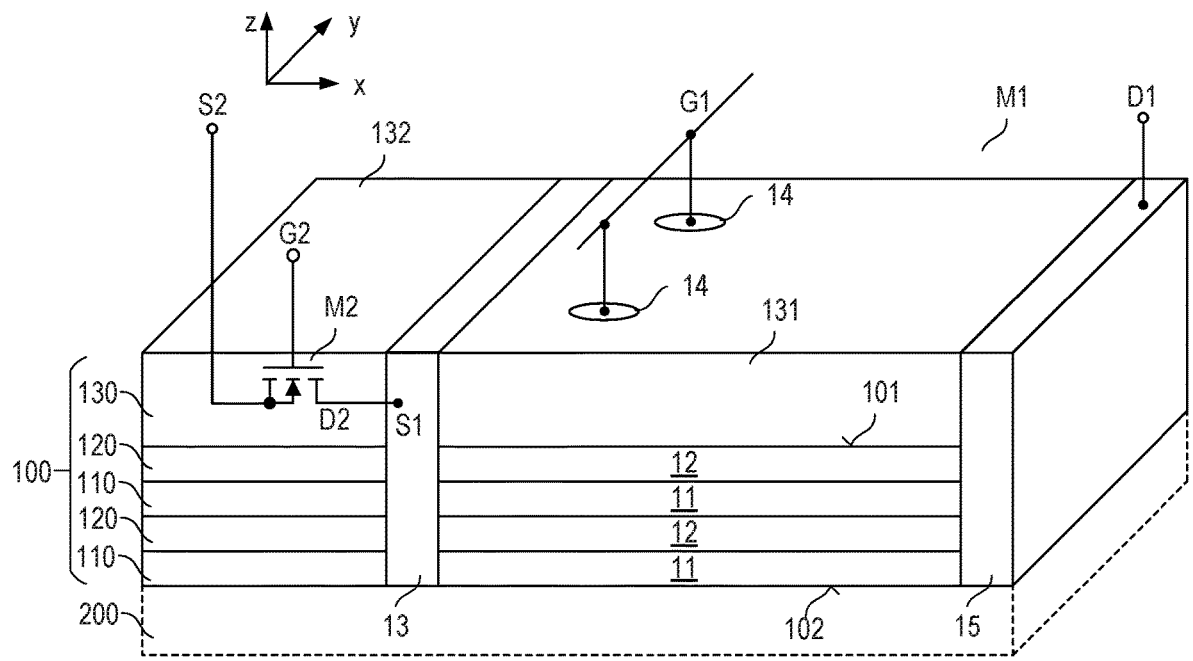
FIGS. 1A-1C schematically illustrate a perspective sectional view (FIG. 1A), a vertical cross-sectional view (FIG. 1B), and a horizontal cross-sectional view (FIG. 1C of a transistor arrangement that includes a first transistor device and a second transistor device integrated in one semiconductor body.
Figure 1B:
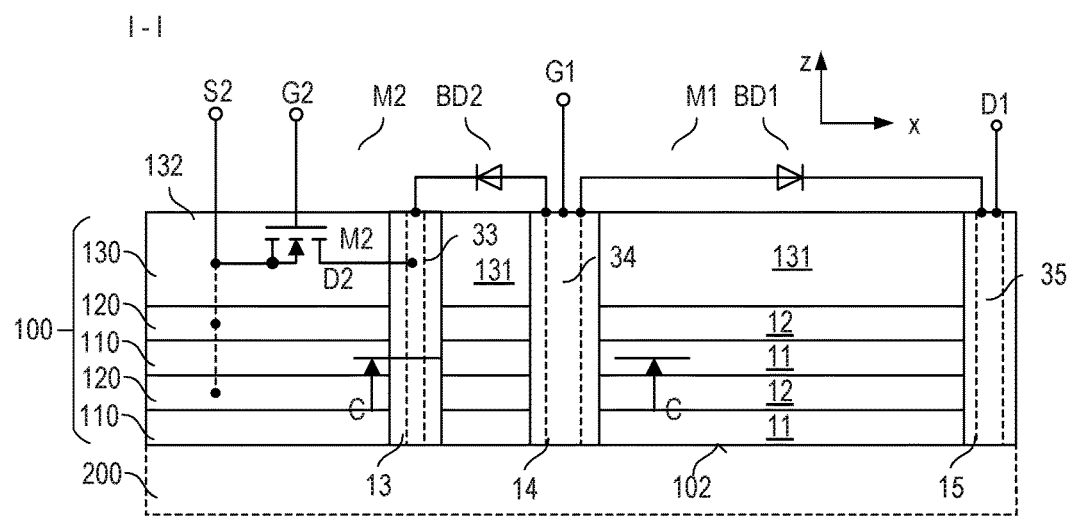
Figure 1C:
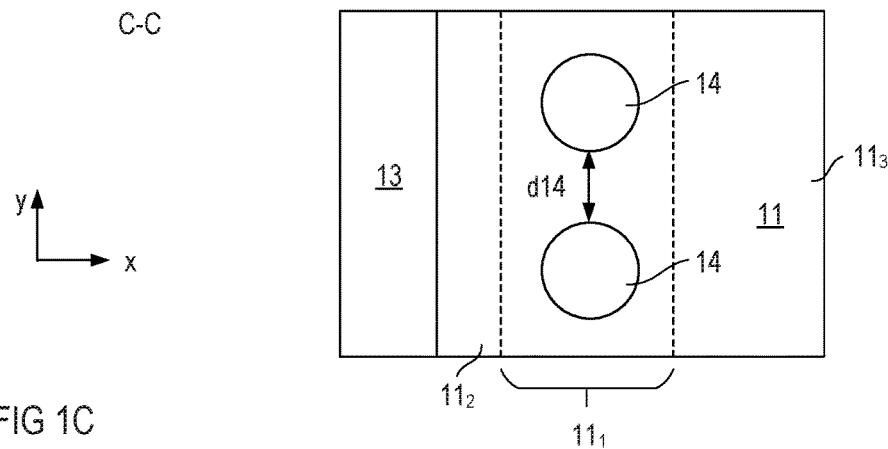

FIGS. 1A to 1C show a perspective sectional view (FIG. 1A), a vertical cross-sectional view (FIG. 1B), and a horizontal cross-sectional view (FIG. 1C) of a semiconductor arrangement that includes a first semiconductor device M1 and a second semiconductor device M2. The first semiconductor device M1 and the second semiconductor device M2 are implemented as transistor devices in FIGS. 1A to 1C. The semiconductor arrangement includes a layer stack with a plurality of first semiconductor layers 110 of a first doping type and a plurality of second semiconductor layers 120 of a second doping type that are arranged alternatingly within the layer stack. The second doping type is complementary to the first doping type. A source region 13 of the first transistor device M1 adjoins the plurality of first semiconductor layers 110, and a drain region 15 of the first transistor device M1 adjoins the plurality of first semiconductor layers 110 and is located spaced apart from the source region 13 in a first direction x (horizontal direction). The source region 13 of the first transistor device M1 is also referred to as first source region or third semiconductor region 13 in the following, and the drain region 15 of the first transistor device M1 is also referred to as first drain region or first semiconductor region 15 in the following. The semiconductor arrangement further includes a plurality of gate regions 14 of the first transistor device M1. Each of the plurality of gate regions 14 adjoins at least one of the plurality of second semiconductor layers 120, is arranged between the first source region 13 and the first drain region 15, and is spaced apart from the first source region 13 and the first drain region 15 in the first direction x.

As used herein, a layer or region of the first doping type is a layer or region with an effective doping of the first doping type. Such region or layer of the first doping type, besides dopants of the first doping type, may also include dopants of the second doping type, but the dopants of the first doping type prevail. Equivalently, a layer or region of the second doping type is a layer or region with an effective doping of the second doping type and may contain dopants of the first doping type.

Referring to FIGS. 1A to 1C, the semiconductor arrangement further includes a third semiconductor layer 130 that adjoins the layer stack with the first layers 110 and the second layers 120 and each of the first source region 13, the first drain region 15, and the gate regions 14. Active regions of a second transistor device M2 are integrated in the third semiconductor layer 130 in a second region 132. The second region 132 is spaced apart from a first region 131 of the third semiconductor layer 130, wherein the first region 131 is bordered by the first source region 13 and the first drain region 15. At least the first region 131 may be a region of the second doping type. The second transistor device M2 is only schematically illustrated in FIGS. 1A and 1B and represented by a circuit symbol.

The third semiconductor layer 130 and the layer stack with the first and second semiconductor layers 110, 120 form an overall layer stack 100, which is also referred to as semiconductor body 100 in the following. The semiconductor body 100 may include a conventional semiconductor material such as, for example, silicon (Si), silicon carbide (SiC), gallium nitride (GaN), gallium arsenide (GaAs), or the like. The semiconductor body 100 may be arranged on any kind of carrier 200 (illustrated in dashed lines in FIGS. 1A and 1B).

According to one example, the overall number of first layers 110 in the layer stack equals the overall number of second layers 120. In the example shown in FIGS. 1A and 1B, an uppermost layer of the layer stack is a second layer 120 and a lowermost layer is a first layer 110. The "uppermost layer" is the layer adjoining the third layer 130, and the "lowermost layer" is the layer spaced apart from the uppermost layer most distantly and adjoining the carrier 200. However, implementing the uppermost layer as a second layer 120 and the lowermost layer as a first layer 110 is only an example. According to another example (not shown), the uppermost layer is a first layer 110 and the lowermost layer is a second layer 120. Just for the purpose of illustration, the layer stack 100 with the first and second layers 110, 120 includes two first layers 110 and two second layers 120, that is, four layers overall. This, however, is only an example. According to one example, the overall number of layers 110, 120 in the layer stack 100 is between 4 and 120, in particular between 6 and 100.

The first direction x, which is the direction in which the first source region 13 and the first drain region 15 are spaced apart from each other, is a first lateral direction of the semiconductor body 100 in the example shown in FIGS. 1A to 1C. A "lateral direction" of the semiconductor body 100 is a direction parallel to a first surface 101 and a second surface 102 of the semiconductor body 100. The first and second layers 110, 120 and the third layer 130 are essentially parallel to the first surface 101 and the second surface 102 in the example shown in FIGS. 1A to 1C. In this example, each of the first source region 13 and the first drain region 15 extend in a vertical direction z in the semiconductor body 100 so that each of the first source region 13 and the first drain region 15 adjoins the third layer 130 and the first layers 110. The "vertical direction" z is a direction perpendicular to the first surface 101 and the second surface 102. Further, the gate regions 14 extend in the vertical direction z in the semiconductor body 100 so that each of the plurality of gate regions 14 adjoins each of the second semiconductor layers 120. The gate regions 14 are spaced apart from each other in a second lateral direction y. This second lateral direction y is different from the first lateral direction x and may be perpendicular to the first lateral direction x.

The first transistor device M1 in the example of FIG. 1 is a lateral superjunction depletion device, more specifically, a lateral superjunction JFET (Junction Field-Effect Transistor). In this transistor device M1, each of the first source region 13 and the first drain region 15 is a region of the first doping type and each of the gate regions 14 is a region of the second doping type. Further, in the section of the semiconductor body 100 between the first source region 13 and the first drain region 15, the first semiconductor layers 110 form drift regions 11 and the second semiconductor layers 120 form compensation regions 12 of the superjunction device.

The function of these drift and compensation regions is explained herein further below.

A type of this first transistor device M1 is defined by the first doping type. The first transistor device M1 is an n-type JFET when the first doping type is an n-type and the second doping type is a p-type. Equivalently, the first transistor device M1 is a p-type JFET when the first doping type is a p-type and the second doping type is an n-type.

According to one example, the first source region 13, the first drain region 15, the plurality of gate regions 14, the first and second layers 110, 120 forming the drift and compensation regions 11, 12, and the third layer 130 are monocrystalline semiconductor regions. According to one example, these regions include monocrystalline silicon (Si) and a doping concentration of the first source region 13 is selected from a range of between 1E17 cm$^{-3}$ (=1·10$^{17}$ cm$^{-3}$) and 1E21 cm$^{-3}$, a doping concentration of the drift regions 11 is selected from a range of between 1E13 cm$^{-3}$ and 1E18 cm$^{-3}$, or between 1E14 cm$^{-3}$ and 5E17 cm$^{-3}$, and a doping concentration of the gate regions 14 is selected from a range of between 1E17 cm$^{-3}$ and 1E21 cm$^{-3}$. The doping concentration of the first drain region 15 can be selected from the same range as the doping concentration of the first source region 13, and the doping concentration of the compensation regions 12 can be selected from the same range as the doping concentration of the drift regions 11.

Referring to FIGS. 1A and 1B, the gate regions 14 of the first transistor device M1 are connected to a first gate node G1 and the first drain region 15 is connected to a first drain node D1. The first gate node G1 and the first drain node D1 are only schematically illustrated in FIGS. 1A and 1B. These nodes G1, D1 may include metallizations (not shown) on top of the semiconductor body 100. Optionally, as illustrated in dashed lines in FIG. 1B, a first connection electrode 34 may be embedded in each of the gate regions 14 and a second connection electrode 35 may be embedded in the drain region 15. The first connection electrodes 34 are connected to the gate node G1 and serve to provide a low-ohmic connection between each section of the gate regions 14 and the first gate node G1. The second electrode 35 is connected to the drain node D1 and provides a low-ohmic connection between each section of the drain region 15 and the drain node D1. Further, a third electrode 33 may be embedded in the first source region 13. Referring to FIG. 1B, each of the first, second and third connection electrodes 34, 35, 33 may extend along a complete length of the respective semiconductor region 14, 15, 13 in the vertical direction z. Each of these electrodes 34, 35, 33 includes an electrically conducting material. Examples of such electrically conducting materials include, but are not restricted to: a metal such as copper (Cu), aluminum (Al), tantalum (Ta), titanium (Ti), cobalt (Co), nickel (Ni) or tungsten (W); a highly doped polycrystalline semiconductor material such as polysilicon; or a metal silicide, such as tungsten silicide (WSi), titanium silicide (TiSi), Cobalt silicide (CoSi), or nickel silicide (NiSi).

Generally, the main function of the third semiconductor layer 130 is to accommodate the second transistor device M2. Therefore, the semiconductor layer 130 is designed such that it provides sufficient space to integrate active regions of the second semiconductor M2 in the second region 132. According to one example, a thickness of the third semiconductor layer 130 in the second region 132 is at least 1 micrometer (μm), in particular at least 4 micrometers. The "thickness" is the dimension of the third layer 130 in the vertical direction z (see, e.g., FIGS. 7 and 8). According to one example, a thickness of the third semiconductor layer 130 is at least twice a thickness of a single first semiconductor layer 110 or a single second semiconductor layer 120. According to one example, a thickness of the third semiconductor layer 130 is at least twice a thickness of each of the first semiconductor layers 110 and the second semiconductor layers 120. The thickness of a single first semiconductor layer 110 or a single second semiconductor layer 120 is, for example, between 100 nanometers (nm) and 3 micrometers (μm). According to another example, a thickness of the third semiconductor layer 130 is greater than a distance between the first source region 13 and each of the gate regions 14.

In or on top of the first region 131, the semiconductor arrangement may include an edge termination structure (not shown in FIGS. 1A to 1C).

At least the first region 131 of the third semiconductor layer 130 is a region of the second doping type so that a first p-n junction is formed between the first drain region 15 and the first region 131 and a second p-n junction is formed between the first source region 13 and the first region 131. These p-n junctions are part of two bipolar diodes, a first bipolar diode BD1 formed by the gate regions 14, the first region 131 and the first drain region 15, and a second bipolar diode BD2 formed by the gate regions 14, the first region 131 and the first source region 13. In each of these bipolar diodes, the first region 131 of the third semiconductor layer 130 forms a base region. Circuit symbols of these bipolar diodes are shown in FIG. 1B. According to one example, a doping concentration of the first region 131 of the third semiconductor layer 130 is such that a voltage blocking capability of the first bipolar diode BD1 is equal to or higher than a voltage blocking capability of the first transistor device M1.

The "voltage blocking capability" of the first transistor device M1 is defined by a maximum level of a voltage between the first drain node D1 and the gate node G1, the first transistor device M1 can withstand in an off-state. Dependent on the specific design, the voltage blocking capability may range from 20V up to several 100 volts. This voltage blocking capability may be adjusted, inter alia, by suitably selecting a distance between the first gate region 14 and the first drain region 15. In a first transistor device M1 with a voltage blocking capability of 650 volts, for example, the distance may be selected from between 40 micrometers and 60 micrometers and a doping concentration of the first region 131 may be selected from a range of between 1E12 cm$^{-3}$ and 1E15 cm$^{-3}$, in particular from between 1.1 E14 cm$^{-3}$ and 4.6E14 cm$^{-3}$. The doping concentration of the first region 131 may be lower than the doping concentration of the plurality of second semiconductor layers 120, for example.

The layer stack with the first and second semiconductor layers 110, 120 adjoins the third layer 130 and, therefore, the second region 132 in which active regions of the second transistor device M2 are integrated. However, the third layer 130 and, in particular, the second region 132 is not obtained based on the first and second layers 110, 120. That is, the second region 132 is not obtained by additionally doping sections of the first and second layers 110, 120 with dopants of the second doping type in order to obtain an effective doping of the second doping type.

Referring to FIGS. 1A and 1B, the first source region 13 is electrically connected to a drain node D2 of the second transistor device M2. The second transistor device M2 further includes a gate node G2 and a source node S2. According to one example, the second transistor device M2 is a normally-off transistor device such as, for example, an enhancement MOSFET. Just for the purpose of illustration, the circuit symbol of the second transistor device M2 shown in FIGS. 1A and 1B represents an n-type enhancement MOSFET. This, however, is only an example. The second transistor device M2 may be implemented as a p-type enhancement MOSFET or a p-type or n-type depletion MOSFET as well.

Optionally, as illustrated in dashed lines in FIG. 1B, those sections of the second semiconductor layers 120 that are arranged below the second region 132 and are separated from those sections that form the compensation regions 12 are connected to the second source node S2. Connections between these second layers 120 and the second source node S2 are only schematically illustrated in FIG. 1B.

The first and the second transistor device M1, M2 can be interconnected in various ways. According to one example, the source node S2 of the second transistor device M2 is connected to the gate node G1 of the first transistor device M1. An electronic circuit diagram of a transistor arrangement in which the gate node G1 of the first transistor device M1 is connected to the source node S2 of the second transistor device M2 is shown in FIG. 2A. Just for the purpose of illustration and the following explanation it is assumed that the first transistor device is an n-type JFET and the second transistor device is an n-type enhancement MOSFET. The second gate node G2, the second source node S2 and the first drain node D1 are circuit nodes that may serve to connect the transistor arrangement to other devices, a power source, ground or the like in an electronic circuit.

The transistor arrangement may include a housing (package) 300 that is schematically illustrated in FIG. 2A. In this case, the second gate node G2, the second source node S2 and the first drain node D1 are external circuit nodes that are accessible outside the housing 300. According to one example, the gate node G1 of the first transistor device M1 is connected to the source node S2 of the second transistor device M2 inside the housing 300. A connection between the second source node S2 and the first gate node G1 may be formed by a wiring arrangement (not shown in the figures) that is located on top of the first surface 101 of the semiconductor body 100. According to another example, the first gate node G1 is accessible outside the housing 300 and the first gate node G1 is connected to the second source node S2 by a connection outside the housing 300.

Although the semiconductor arrangement includes two transistors, first transistor device (JFET) M1 and second transistor device (MOSFET), it can be operated like one single transistor. An operation state of the semiconductor arrangement is defined by an operation state of the MOSFET M2. The semiconductor arrangement acts like a voltage controlled transistor that switches on or off dependent on a drive voltage $V_{GS2}$ received between the second gate node G2 and the second source node S2. This drive voltage is also referred to as gate-source voltage $V_{GS2}$ in the following.

The function of the semiconductor arrangement shown in FIGS. 1A-1C and 2A is explained below. Just for the purpose of explanation, it is assumed that the first transistor device M1 is an n-type JFET and the second transistor device M2 is an n-type enhancement MOSFET. Furthermore, for the purpose of explanation, it is assumed that the transistor arrangement operates as an electronic switch connected in series with a load Z, wherein a series circuit with the load Z and the transistor device receives a supply voltage V1.

Figure 2C:
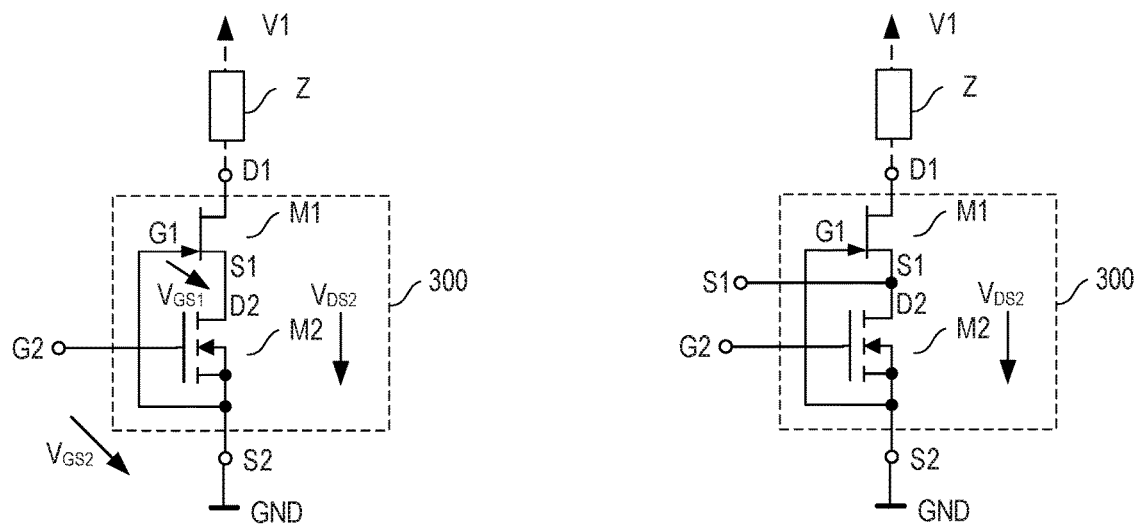
Figure 2C:
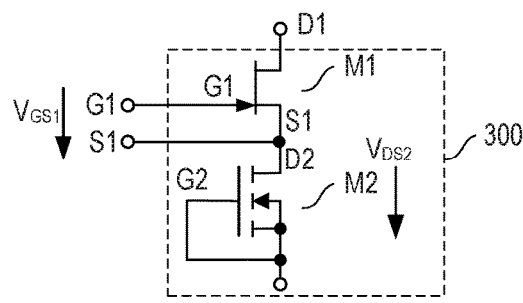

Referring to FIG. 2, the MOSFET M2 is controlled by the gate-source voltage $V_{GS2}$ received between the second gate node G2 and the second source node S2. The MOSFET M2 is in an on-state (conducting state) when a voltage level of the gate-source voltage $V_{GS2}$ is higher than a predefined threshold voltage level $V_{th1}$. In an n-type enhancement MOSFET, the threshold voltage level $V_{th1}$ is a positive voltage level. The JFET M1 is controlled by a gate-source voltage $V_{GS1}$ received between the first gate node G1 and the first source node S1. An n-type JFET, such as the JFET M1 shown in FIG. 2, is in the on-state when a voltage level of the gate-source voltage, such as the gate-source voltage $V_{GS1}$ shown in FIG. 2, is higher than a predefined threshold level $V_{th2}$. That is, the JFET M1 is in the on-state, when $V_{GS1} > V_{th1}$, where $V_{th1} < 0$. As the gate node G1 of the JFET M1 is connected to the source node S2 of the MOSFET M2, the gate-source voltage $V_{GS1}$ of the JFET M1 equals the inverted drain-source voltage $V_{DS2}$ of the MOSFET M2, that is, $V_{GS1} = -V_{DS2}$. The drain-source voltage $V_{DS2}$ of the MOSFET M2 is the voltage between the drain node D2 and the source node S2 of the MOSFET M2.

When the MOSFET M2 is in the on-state, a magnitude of the drain-source voltage $V_{DS2}$ is very low, so that the gate-source voltage $V_{GS1}$ of the JFET is between the negative threshold level $V_{th1}$ and zero. Thus, the JFET M1 is also in the on-state. When the MOSFET M2 switches off, the drain-source voltage $V_{DS2}$ increases until the inverted drain-source voltage $-V_{DS2}$ reaches the negative threshold voltage $V_{th1}$, so that the JFET M1 also switches off.

Referring to FIGS. 1A-1C, in the on-state of the JFET M1 and the MOSFET M2, a current can flow from the first drain node D1 via the drain region 15, the drift regions 11, the first source region 13, and the drain-source path D2-S2 of the MOSFET M2 to the second source node S2. When the MOSFET M2 switches off, the electrical potential at the first drain node D1 can increase relative to the electrical potential at the second source node S2. This increase of the electrical potential at the first drain node D1 causes an increase of the electrical potential at the first source region 13, while the electrical potential at the gate regions 14 is tied to the electrical potential at the second source node S2. The increase of the electrical potential of the first source region 13 and the drift regions 11 causes p-n junctions between the first source region 13 and the compensation regions 12, and between the gate regions 14 and the drift regions 11 to be reverse biased. Furthermore, p-n junctions between the drift regions 11 and the compensation regions 12 are reverse biased. Reverse biasing those p-n junctions causes the drift regions 11 to be depleted of charge carriers. The JFET M1 switches off as soon as the drift regions 11 between the at least two gate regions 14 and/or between the gate regions 14 and the first source region 13 have been completely depleted of charge carriers.

FIG. 1C shows a horizontal cross-sectional view of the transistor device in a horizontal section plane C-C going through one of drift regions 11. In FIG. 1C, reference character $11_1$ denotes a section of the drift region 11 between two gate regions 14, and $11_2$ denotes a section of the at least one drift region 11 between the gate regions 14 and the first source region 13. The threshold voltage $V_{th1}$ of the JFET M1 is the voltage that needs to be applied between the gate regions 14 and the first source region 13 in order to completely deplete at least one of these sections $11_1$, $11_2$. In FIGS. 1C, d14 denotes a distance between two gate regions 14 in the second direction y. The magnitude (the level) of the threshold voltage $V_{th1}$ is dependent on several design parameters and can be adjusted by suitably designing these parameters. These design parameters include the (shortest) distance d14 between two gate regions 14, a doping concentration of the drift region 11 in the section $11_1$ between the gate regions 14, and a doping concentration of the compensations regions 12 (out of view in FIG. 1C) in a section that is located between the gate regions 14 and adjoins section $11_1$ of the drift regions 11.

According to one example, the drift regions 11 in the section $11_1$ between the gate electrodes 14 include a higher doping concentration than in sections $11_2$ spaced apart from the gate regions 14 in the direction of the drain region 13. This higher doped section $11_1$ counteracts an increase in the on-resistance caused by the gate regions 14, which reduce the cross section in which a current can flow between the source and drain regions 13 and 15. According to one example, the compensation regions 12 at least in parts of sections $11_1$ arranged between the gate regions 14 include a higher doping concentration than in other sections, in particular, those sections $11_3$ spaced apart from the gate electrodes 14 in the direction of the drain region 15. This higher doped section ensures that the drift regions 11 in the section $11_1$ between the gate regions 14 are depleted of charge carriers, so that the JFET M1 blocks, when the threshold voltage $V_{th1}$ is applied. According to one example, the higher doped region of the compensation regions 12 is not only arranged between the gate regions 14, but surrounds the gate regions 14 in a horizontal plane, which is a plane parallel to the first surface 101.

The MOSFET M2 is designed such that a voltage blocking capability of this MOSFET M2 equals or is higher than a magnitude of a threshold voltage $V_{th1}$ of the JFET M1, that is, $V_{DS2\_MAX} \geq |V_{th1}|$, where $V_{DS2\_MAX}$ is the voltage blocking capability of the MOSFET M2. The voltage blocking capability of the MOSFET M2 is the maximum voltage, the MOSFET M2 can withstand between the drain node D2 and the gate node G2.

Figure 2D:
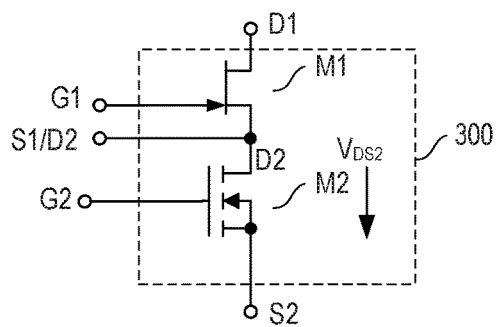

In the example shown in FIG. 2A, the semiconductor arrangement includes three external circuit nodes, the first drain node D1, the second source node S2, and the second gate node G2. According to another example shown in FIG. 2B, additionally to these circuit nodes D1, S2, G2, the first source node S1 is also accessible. According to yet another example shown in FIG. 2C, the second transistor M2 may be deactivated by connecting the second gate node G2 with the second source node S2. In this case, only the first transistor device M1 is active and can be driven by applying a drive voltage $V_{GS1}$ between the first gate node G1 and the first source node S1. According to one example, the first drain node D1, the first gate node G1, the first source node S1, the second gate node G2, and the second source node S2 are external circuit nodes that are accessible outside the housing 300. In this case, a user/costumer may choose one of the configurations shown in FIGS. 2A to 2C by suitably connecting these circuit nodes D1, G1, S1, G2, and S2. FIG. 2D illustrates another example. In this example, the source nodes S1, S2, the drain nodes D1, D2, and the gate nodes G1, G2 of each of the first and second transistor device M1, M2 are accessible outside of the housing 300.

According to one example, the first and second layers 110, 120 are implemented such that the drift regions 11 and the compensation regions 12 are essentially balanced with regard to their dopant doses. That is, at each position in the current flow direction of the first transistor device, the amount of dopant atoms (dopant charges) in one drift region 11 essentially corresponds to the amount of dopant atoms in the neighboring compensation region 12. "Essentially" means that there may be an imbalance of up to +/−10%. That is, there may be 10% more or less dopant atoms in the drift regions 11 than in the compensation regions 12. Thus, when the first transistor device M1 is in the off-state and depletion regions (space charge regions) expand in the drift and compensation regions 11, 12 essentially each doping atom in each drift region 11 has a corresponding doping atom (which may be referred to as counter doping atom) of a complementary doping in the compensation regions 12 and the drift and compensation regions 11, 12 can completely be depleted. As is commonly known, compensation regions in a superjunction transistor device, e.g., JFET M1 shown in FIGS. 1A-1C and 2A-2D, make it possible to implement the drift regions with a higher doping concentration than in a conventional, non-superjunction device. This reduces the on-resistance, which is the electrical resistance in the on-state, without decreasing the voltage blocking capability.

Figures 3A, 3B:
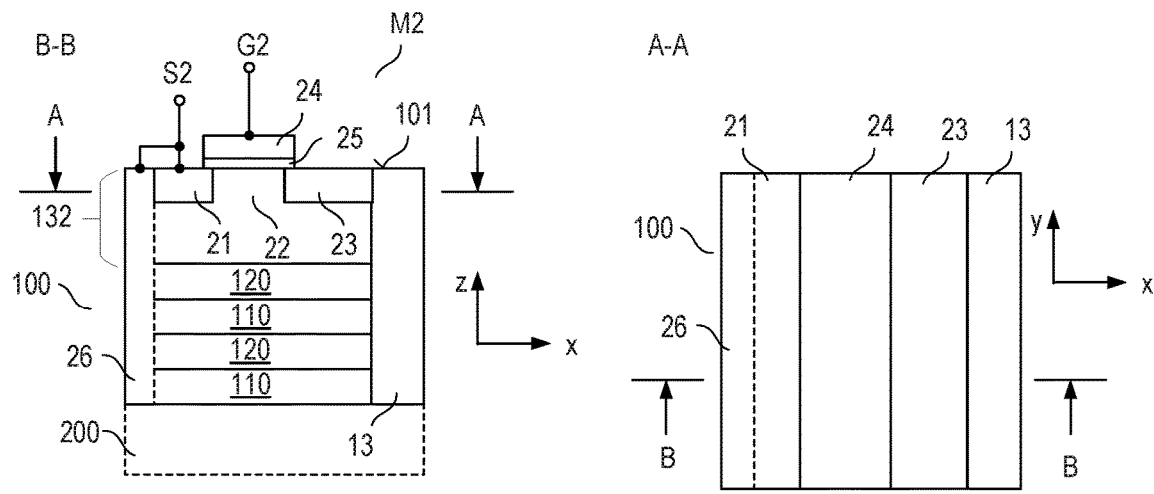
FIGS. 3A-3B illustrate one example of the second transistor device.

Referring to the above, the second transistor device M2 may be implemented in various ways. Some examples for implementing the second transistor M2 are explained with reference to FIGS. 3A-3B, 4, 5 and 6A-6B below. FIGS. 3A and 3B show a first example of the second transistor device M2, wherein FIG. 3A shows a vertical cross-sectional view and FIG. 3B shows a horizontal cross-sectional view of the second transistor device M2. Referring to FIG. 3A, the second transistor device M2 includes a source region 21 and a drain region 23 spaced apart from the source region 21 in the first lateral direction x. The drain region 23 adjoins the source region 13 of the first transistor device M1 in order to electrically connect the source region 13 of the first transistor device M1 with the drain region 23 of the second transistor device M2. The drain region 23 of the second transistor device M2 is also referred to as second drain region in the following. The source region 21 of the second transistor device M2, which is also referred to as second source region 21 in the following, and the second drain region 23 are separated by a body region 22. The body region 22 has a doping type that is complementary to the doping type of the second source region 21 and the second drain region 23. A doping concentration of the body region 22 is, for example, selected from a range of between 1E16 $cm^{-3}$ and 1E19 $cm^{-3}$, in particular from between 1E17 $cm^{-3}$ and 1E18 $cm^{-3}$.

The second transistor device M2 may be implemented as an enhancement device (normally-off device) or a depletion (normally on-device). In a normally-off device, the body region 22 adjoins the gate dielectric 25 (and the gate electrode 24, in the on-state of the second transistor device M2, generates an inversion channel in the body region 22 along the gate dielectric 25). In a normally-on device, a channel region (not shown) of the first doping is arranged between the body region 22 and the gate dielectric 25 and extends from the second source region 21 to the second drain region 23 (and the gate electrode 24, in the off-state of the second transistor device M2, depletes the channel region of charge carriers).

In the example shown in FIGS. 3A and 3B the second drain region 23 adjoins the first source region 13. This, however, is only an example. According to another example (not shown), the second drain region 23 and the first source region 13 are connected via a wiring arrangement located on top of the first surface 101 of the semiconductor body 100.

Referring to FIG. 3A, a gate electrode 24 is arranged adjacent to the body region 22 and dielectrically insulated from the body region 22 by a gate dielectric 25. This gate electrode 24 is electrically connected to the second gate node G2. The second source region 21 is electrically connected to the second source node S2. According to one example, the second transistor device M2 is an n-type transistor device. In this case, the second source region 21 and the second drain region 23 is n-doped, while the body region 22 is p-doped. According to another example, the second transistor device M2 is a p-type transistor device. In this case, the second source region 21 and the second drain region 23 are p-doped semiconductor regions, while the body region 22 is an n-doped semiconductor region. The second transistor device M2 shown in FIG. 3A is an enhancement transistor device. In this transistor device, the body region 22 adjoins the gate dielectric 25. According to another example (not shown), the second transistor device M2 is a depletion transistor device. In this case, there is a channel region of the same doping type as the second source region 21 and the second drain region 23 arranged between the body region 22 and the gate dielectric 25 and extends from the second source region 21 to the second drain region 23. Referring to FIG. 3B, which shows a horizontal cross-sectional view of the second transistor device M2, the second source region 21, the second drain region 23, and the body region 22 may be elongated in the second lateral direction y of the semiconductor body 100.

Referring to FIG. 3B, a connection region 26 of the second doping type may be connected to the second source node S2 and extend through the second region 132 and the layer stack with the first and second layers 110, 120. This connection region 26 connects those sections of the second layers 120 that are arranged below the second region 132 to the second source region S2. Those sections of the first layers 110 that are arranged below the second region 132 are connected to the first source region 13 and, as the first source region 13 is connected to the second drain region 23, to the second drain region 23. Because of the fact that, below the second region 132, the second layers 120 are connected to the second source node S2 and that the first layers 110 are connected to the second drain node D2 a depletion region can expand in the first and second layer sections 110, 120 below the second region 132 when the second transistor device M2 is in the off-state.

Figure 4:
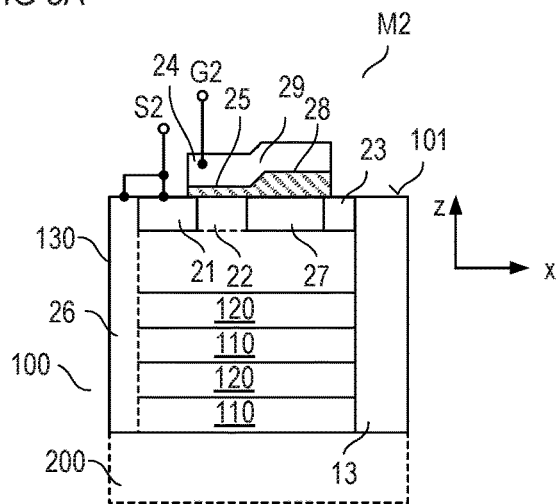
FIGS. 4, 5 and 6A-6B illustrate further examples of the second transistor device.

FIG. 4 shows a modification of the transistor device shown in FIGS. 3A and 3B. In this modification, the transistor device M2 includes a drift region 27 (which may also be referred to as drain extension) between the body region 22 and the drain region 23. The drift region 27 has a lower doping concentration than the drain region 23 and the same doping type as the drain region 23. A field electrode 29 is adjacent the drift region 27 and dielectrically insulated from the drift region 27 by a field electrode dielectric 28. According to one example, the field electrode dielectric 28 is thicker than the gate dielectric 25. As illustrated, the field electrode 29 may be electrically connected with the gate electrode 24, for example, by forming the gate electrode 24 and the field electrode as one conductive layer. This is illustrated in FIG. 4. According to another example (not shown), the field electrode 29 is electrically connected to the second source node S2 and electrically insulated from the gate electrode 24.

Figure 5:
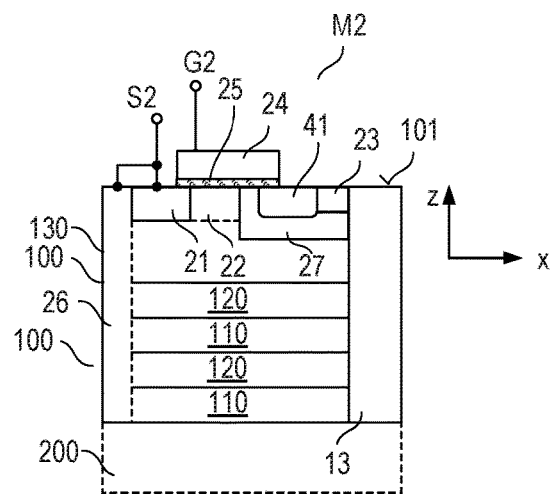

FIG. 5 shows another modification of the transistor device shown in FIGS. 3A and 3B. In the example shown in FIG. 5, the gate electrode 24 and the gate dielectric 25 overlap the drift region 27, but, in the first lateral direction x, do not extend to the drain region 23. An insulation region 41 is arranged between the drift region 27 and those regions of the first surface 101 that are not covered by the gate electrode 24 and the gate dielectric 25. This insulation region 41 may adjoin the drain region 23, as shown in FIG. 5. In this example, the drift region 27 adjoins the drain region 23 in a region spaced apart from the first surface 101. The insulation region 41 may include a conventional electrically insulating material such as an oxide. The insulation region 41 may be implemented as a so called STI (Shallow Trench Isolation) and include a thermally grown oxide.

Figure 6A:
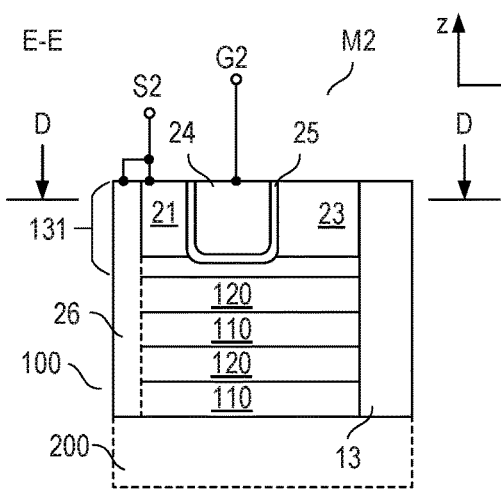
Figure 6B:
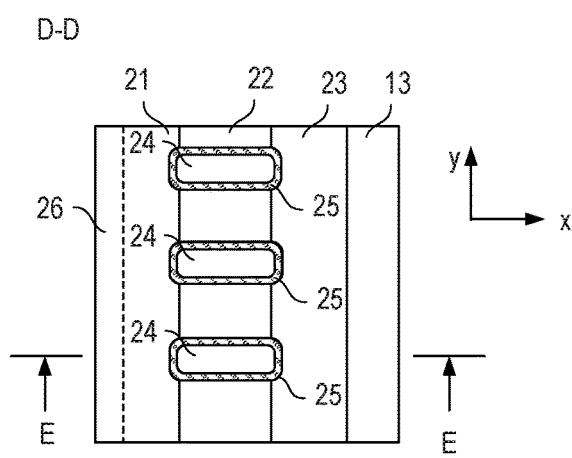

In the example shown in FIGS. 3A, 4, and 5, the gate electrode 24 is arranged on top of the first surface 101 of the semiconductor body 100. This, however, is only an example. According to another example shown in FIGS. 6A and 6B, there are several gate electrodes 24 that are arranged in trenches extending from the first surface 101 into the semiconductor body 100. Each of these gate electrodes 24, in the first lateral direction x, extends from the second source region 21 to the second drain region 23 through the body region 22 and is dielectrically insulated from these semiconductor regions 21, 22, 23 by a gate dielectric 25. Each of these gate electrodes 24 is electrically connected to the second gate node G2, which is schematically illustrated in FIG. 6A.

Second transistor devices of the type shown in FIGS. 3A to 3B, 4, 5 and 6A to 6B can be implemented using conventional implantation and oxidation processes known from integrated CMOS (Complementary Metal Oxide Semiconductor) processes. The second transistor device may therefore also be referred to as CMOS device. The second region 132 may have a basic doping of the second doping type or may be intrinsic before forming the active regions (source, body and drain regions 21, 22, 23) of the second transistor device M2 in the second region 132. The basic doping concentration can be selected such that it essentially equals the doping concentration of the body region 22 or is lower than the doping concentration of the body region 22.

Figure 7:
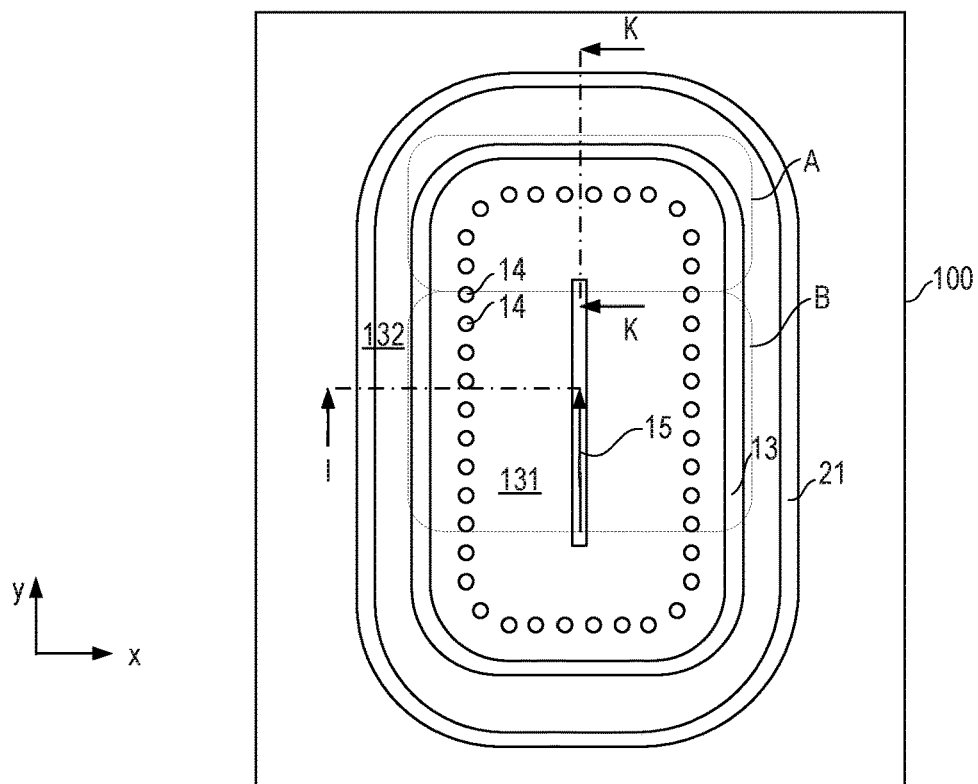
FIG. 7 shows a top view of a transistor arrangement according to one example.

The transistor arrangement may be designed such that the first source region 13, in a horizontal plane of the semiconductor body 100, surrounds the first drain region 15. One example of a transistor arrangement of this type is shown in FIG. 7, which shows a top view of the semiconductor body 100 of this type of transistor arrangement. In this transistor arrangement, the second transistor device M2, from which only the source region 21 is illustrated in FIG. 7, surrounds the first transistor device M1 in the horizontal plane of the semiconductor body 100. The layer stack with the first and second layers 110, 120 is out of view in FIG. 7. The layer stack is arranged below the third layer 130 with the first region 131 and the second region 132 shown in FIG. 7.

In the example shown in FIG. 7, the first drain region 15 is an elongated region so that the first source region 13 and the second source region 21 each have essentially the form of a rectangular ring. The gate regions 14 are spaced apart from each other and are arranged such that they are essentially located on a line that has the form of a rectangle (with rounded corners).

In the transistor arrangement shown in FIG. 7, the first and second transistor device M1, M2 may be implemented in accordance with any of the examples explained herein before. Thus, in each of section planes I-I or K-K shown in FIG. 7, the transistor device may be implemented as explained before.

In the example shown in FIG. 7, a distance between the first drain region 15 and the first source region 13, at each position, is greater than a minimum distance required to obtain a desired voltage blocking capability of the first transistor device M1. A distance between the gate regions 14 and the first drain region 15 is larger than a distance between the gate regions 14 and the first source region 13.

The semiconductor device comprises at least one first region A and a second region B. The elongated first drain region 15 has a first end that is arranged in one of the first regions A. The first drain region 15 extends from the first end arranged in the first region A in a horizontal direction y into the second region B. A second end of the first drain region 15 may be arranged in another first region A (not specifically indicated in FIG. 7). Those parts of the first drain region 15 that are arranged between the first end and the second end are arranged in the second region B.

Figure 8:
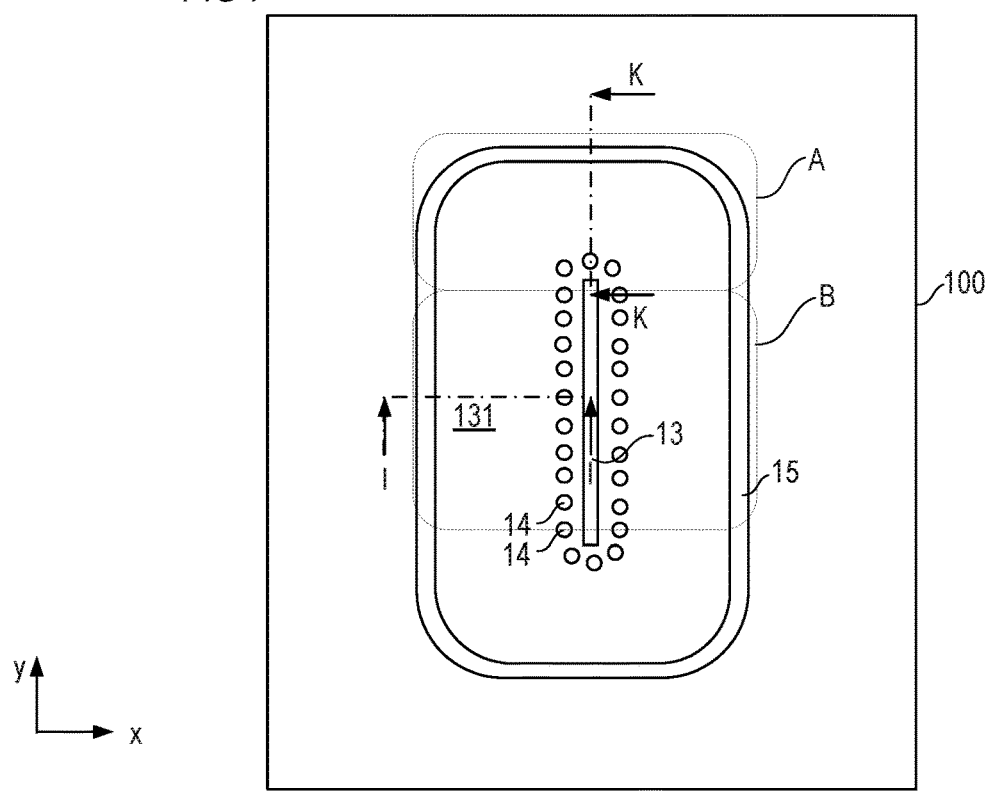
FIG. 8 shows a top view of a transistor arrangement according to another example.

The arrangement illustrated in FIG. 7 is often referred to as "drain centered" arrangement. This, however, is only an example. As is illustrated in FIG. 8, for example, it is also possible that the first drain region 15, in a horizontal plane of the semiconductor body 100, surrounds the first source region 13. In the example of FIG. 8, the first source region 13 is an elongated region so that the first drain region 15 essentially has the form of a rectangular ring. The gate regions 14 are spaced apart from each other and are arranged such that they are essentially located on a line that has the form of a narrow rectangle (with rounded corners). Again, a distance between the first drain region 15 and the first source region 13, at each position, is greater than a minimum distance required to obtain a desired voltage blocking capability of the first transistor device M1. A distance between the gate regions 14 and the first drain region 15 is larger than a distance between the gate regions 14 and the first source region 13.

Similar to what has been explained with respect to FIG. 7 above, the semiconductor device comprises at least one first region A and a second region B. The elongated first source region 13 has a first end that is arranged in one of the first regions A. The first source region 13 extends from the first end arranged in the first region A in a horizontal direction y into the second region B. A second end of the first source region 13 may be arranged in another first region A (not specifically indicated in FIG. 8). Those parts of the first source region 13 that are arranged between the first end and the second end are arranged in the second region B. The arrangement illustrated in FIG. 8 is often referred to as "source centered" arrangement.

Figure 9:
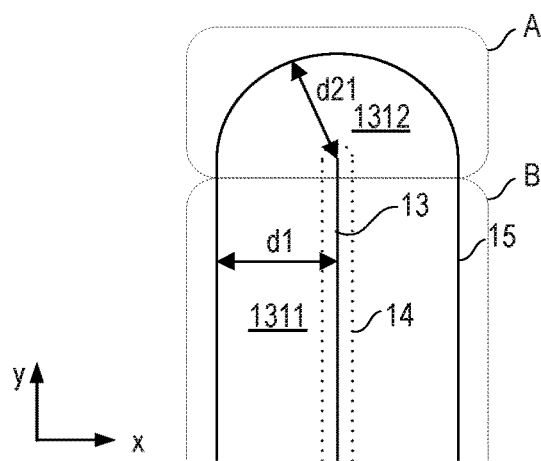
FIG. 9 shows a top view of a section of a transistor arrangement according to one example.
Figure 10:
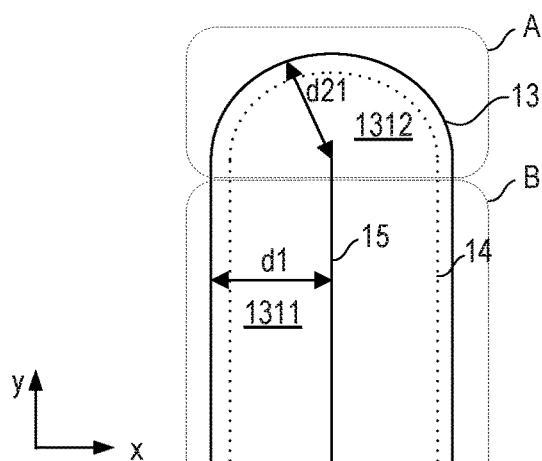
FIG. 10 shows a top view of a section of a transistor arrangement according to one example.

According to one example, a distance between the first drain region 15 and the first source region 13 is essentially constant. That is, a distance d1 between the first drain region 15 and the first source region 13 in the second region B may equal a distance d21 between the first drain region 15 and the first source region 13 in the first region A. This is exemplarily illustrated in FIGS. 9 (source centered arrangement) and 10 (drain centered arrangement). That is, a section 1311 of the first region 131 of the third semiconductor layer 130 arranged in the second region B may have the same width d1 along a shortest path between the first source region 13 and the first drain region 15 as a section 1312 of the first region 131 of the third semiconductor layer 130 arranged in the first region A.

Figure 11:
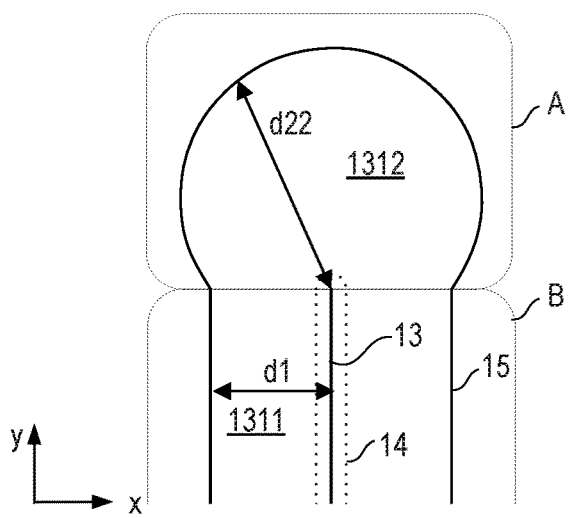
FIG. 11 shows a top view of a section of a transistor arrangement according to one example.
Figure 12:
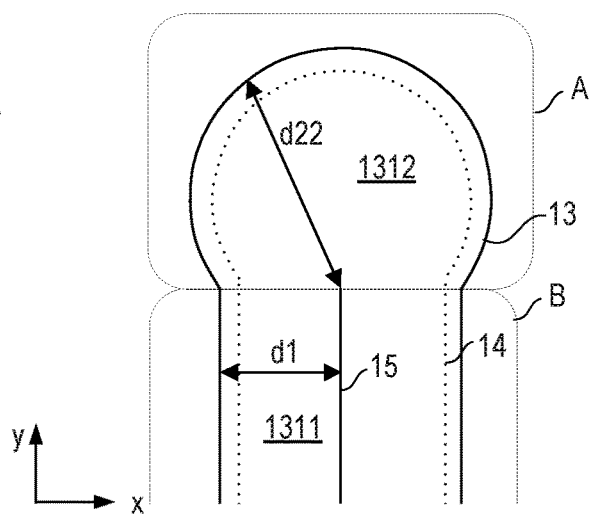
FIG. 12 shows a top view of a section of a transistor arrangement according to one example.

The electric field strength in each of the at least one first region A is generally greater than the field strength in the second region B. This, however, reduces the breakdown voltage. In order to increase a breakdown voltage of the first semiconductor device M1 in the first region A and therefore the breakdown voltage of the overall device, a distance d22 between the first drain region 15 and the first source region 13 in the first region A may be greater than a distance d1 between the first drain region 15 and the first source region 13 in the second region B. This is exemplarily illustrated in FIGS. 11 (source centered arrangement) and 12 (drain centered arrangement). Generally, the breakdown voltage increases if the distance between the first drain region 15 and the first source region 13 increases. This, however, has the disadvantage of an area increase which results in an increase of the costs for the semiconductor device. The different embodiments described herein may be used in applications at voltages of 20V or more.

Instead of or in addition to increasing the distance d22 between the first drain region 15 and the first source region 13 in the first region A, the semiconductor device may comprise a fourth semiconductor region 16 adjoining the plurality of first semiconductor layers 110. The fourth semiconductor region 16 may be spaced apart from the first source region 13 (source centered arrangement) or from the first drain region 15 (drain centered arrangement), and may be arranged in the first region A of the semiconductor device between the first end of the first source region 13 and the first drain region 15 (source centered arrangement, see FIG. 13) or from the first end of the first drain region 15 and the first source region 13 (drain centered arrangement, see FIG. 14). A plurality of gate regions 14 is arranged between the fourth semiconductor region 16 and the first drain region 15 (source centered arrangement, see FIG. 13), or between the fourth semiconductor region 16 and the first source region 13 (drain centered arrangement, see FIG. 14).

Generally speaking, a semiconductor device may comprise a plurality of gate regions 14. A first number of the plurality of gate regions 14 may be arranged in the first region A, and a second number of the plurality of gate regions 14 may be arranged in the second region B of the semiconductor device. According to one example, the first number of the plurality of gate regions 14 may be one. The arrangement would essentially correspond to a configuration similar to a diode in the first region A. According to another example, the first number of the plurality of gate regions 14 may be greater than one. The first region A in the latter case could be referred to as an active region.

Figure 13:
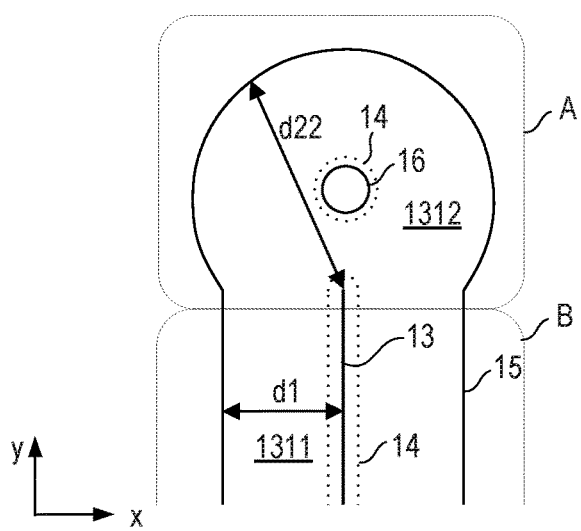
FIG. 13 shows a top view of a section of a transistor arrangement according to one example.

Referring to FIG. 13, the first source region 13 is surrounded by a first plurality of gate region 14. The fourth semiconductor region 16 is surrounded by a second plurality of gate regions 14. The fourth semiconductor region 16 may have a rounded cross-section for example. The second plurality of gate regions 14 may be arranged such that they are essentially located on a line that has the form of a circle. The second plurality of gate regions 16 is arranged closer to the fourth semiconductor region 16 than to the first drain region 15. The first plurality of gate regions 14 and the second plurality of gate regions 14 are separate from each other and do not lie on a common continuous line. The fourth semiconductor region 16 may be of the same doping type as the first source region 13 and the first drain region 15.

Figure 14:
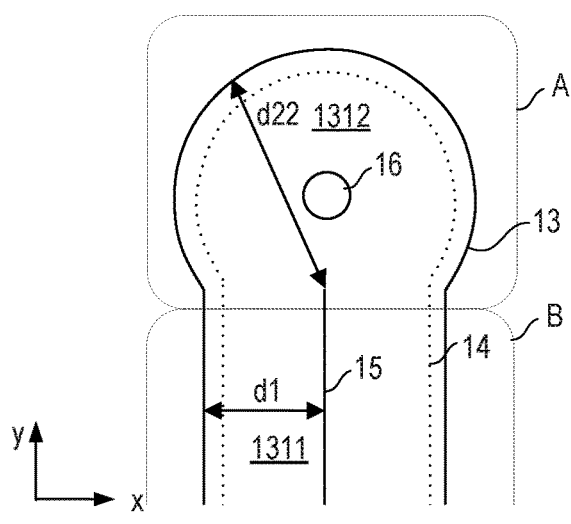
FIG. 14 shows a top view of a section of a transistor arrangement according to one example.

Now referring to the drain centered arrangement of FIG. 14, the plurality of gate regions 14 may be arranged on a line which has essentially the same shape as the first source region 13. A distance between this line on which the plurality of gate regions 14 is arranged and the first source region 13 may be essentially constant. Consequently, a distance between the plurality of gate regions 14 and the first drain region 15 in the first region A may be larger than a distance between the plurality of gate regions 14 and the first drain region 15 in the second region B.

Instead of a single region having a rounded cross-section, the fourth semiconductor region 16 may comprise one or more sub-sections, each of the sub-sections having the form of a circle. An example of a fourth semiconductor region 16 having three sub-sections, each in the form of a circle is exemplarily illustrated in FIG. 16 for a drain centered arrangement. A doping concentration of the fourth semiconductor region 16 can be selected from the same range as the doping concentration of the first drain region 15 and the first source region 13.

Instead of or in addition to increasing the distance d22 between the first drain region 15 and the first source region 13 in the first region A and/or instead of or in addition to adding a fourth semiconductor region 16, a doping concentration in the first layers 110, or in the second layers 120, or in both, in the first region A may be different from a doping concentration of the first and/or second layers 110, 120 in the second region B.

Figure 15:
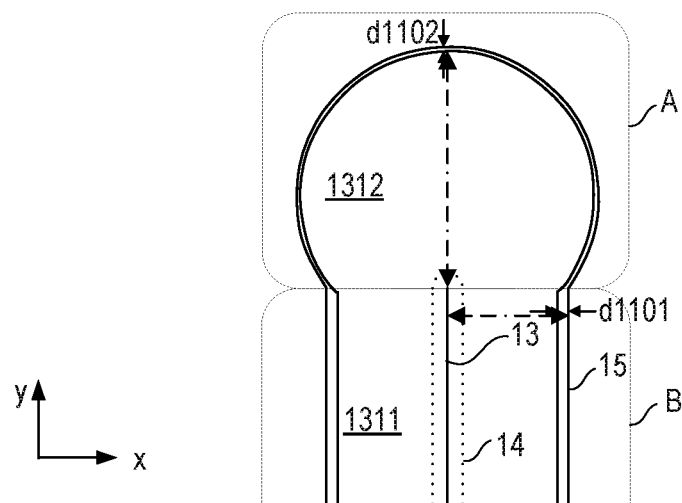
FIG. 15 shows a top view of a section of a transistor arrangement according to an example.

For example, a doping concentration in the first and/or second layers 110, 120 in the first region A may be lower than a doping concentration of the respective first and/or second layers 110, 120 in the second region B. A doping concentration in this context may refer to an average doping concentration along a shortest path between the first source region 13 and the first drain region 15. In the example illustrated in FIG. 15, the shortest path between the first source region 13 and the first drain region 15 for one exemplary position along the first drain region 15 in the second region B is indicated by means of a first arrow. The shortest path between the first source region 13 and the first drain region 15 for one exemplary position along the first drain region 15 in the first region A is indicated by means of a second arrow.

According to one example, the doping concentration along the shortest path between the first source region 13 and the first drain region 15 is homogenous. That is, a doping concentration may be increased or decreased for the complete first and/or second layer 110, 120 in the first region A as compared to the second region B. According to another example, the doping concentration is different for different sections along the shortest path between the first source region 13 and the first drain region 15. This is exemplarily illustrated in FIG. 15.

A basic doping concentration in the first and/or second layers 110, 120 in the first region A may be the same as a basic doping concentration in the first and/or second layers 110, 120 in the second region B. However, a doping concentration may be locally increased in a section adjacent to the first drain region 15, for example. This section of increased doping concentration may have a width d1101 in the second region B which is larger than a width d1102 of the section of increased doping concentration in the first region A. In this way, an average doping concentration along a direct path between the first drain region 15 and the first source region 13 is greater in the second region B than in the first region A.

Figure 16:
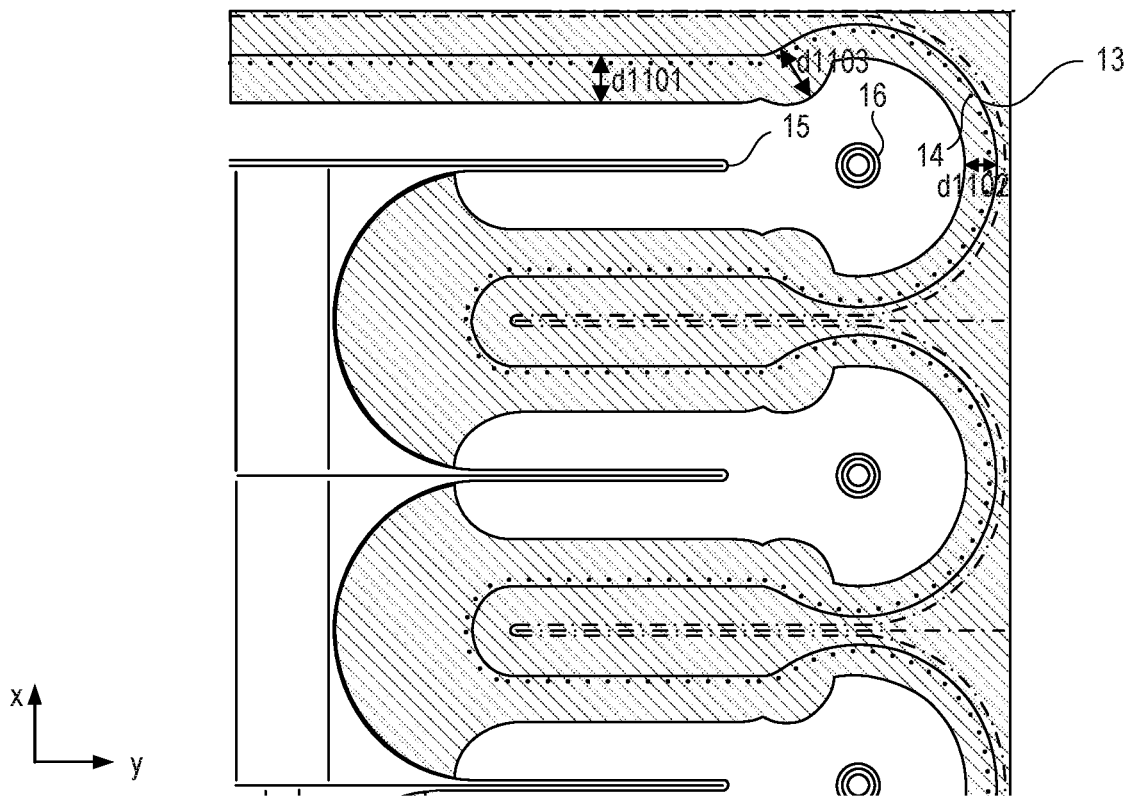
FIG. 16 shows a top view of a section of a transistor arrangement according to another example.

This is further illustrated in the example of FIG. 16. In the top view illustrated in FIG. 16, a comb-shaped arrangement is exemplarily illustrated. In this comb-shaped arrangement, a plurality of source centered arrangements is combined with a plurality of drain centered arrangements. The shaded areas indicate those areas of the first and/or second layers 110, 120 with an increased doping concentration. According to one example, a basic doping concentration may be introduced into the first and second layers 110, 120 in a first step. In a second step, an additional mask may be used in order to locally increase the doping concentration in certain areas of the first and second layers 110, 120.

According to an even further example, and as is exemplarily illustrated in FIG. 16, there may be additional areas in the range of the border between the first area A and the second area B, in which the area of locally increased doping concentration has a third width d1103. These additional areas may have the shape of an arc or bow when seen in the top view of FIG. 16. In this way, the breakdown voltage may be optimized even further. Such additional areas, however, may also be omitted.

According to one example, in the at least one of the first semiconductor layers 110 and/or in the at least one of the second semiconductor layers 120, the concentration of dopant atoms of the second type along a shortest path between the first drain region 15 and the first source region 13 in the first region A is between 10% and 30% lower than the concentration of dopant atoms of the second type in the same layer 110, 120 in the second region B of the semiconductor device. According to another example, in the at least one of the first semiconductor layers 110 and/or in the at least one of the second semiconductor layers 120, the concentration of dopant atoms of the second type along a shortest path between the first drain region 15 and the first source region 13 in the first region A is 15% lower than the concentration of dopant atoms of the second type in the same layer 110, 120 in the second region B of the semiconductor device. In the given examples, the first drain region 15 may be an elongated region and the first source region 13, in a horizontal plane of the semiconductor body 100, may surround the first drain region 15 (drain centered).

According to another example, in the at least one of the first semiconductor layers 110 and/or in the at least one of the second semiconductor layers 120, the average concentration of dopant atoms of the first type along a shortest path between the first semiconductor region 13 and the third semiconductor region 15 in the first region A is between 10% and 30% higher than the concentration of dopant atoms of the first type in the same layer 110, 120 in the second region B of the semiconductor device. According to an even further example, in the at least one of the first semiconductor layers 110 and/or in the at least one of the second semiconductor layers 120, the average concentration of dopant atoms of the first type along a shortest path between the first semiconductor region 13 and the third semiconductor region 15 in the first region A is 22% higher than the concentration of dopant atoms of the first type in the same layer 110, 120 in the second region B of the semiconductor device. In the given examples, the first source region 13 may be an elongated region and the first drain region 15, in a horizontal plane of the semiconductor body 100, may surround the first source region 13 (source centered).

Instead of or in addition to the different features described above, another feature for increasing the breakdown voltage of the semiconductor device may be implemented. This is described with respect to FIGS. 17 to 20 below. Now referring to FIG. 17, a vertical cross-sectional view of a transistor arrangement according to one example is schematically illustrated. The general structure of the semiconductor device corresponds to the arrangement as described with respect to FIGS. 1 to 7 above. That is, the semiconductor device comprises a layer stack with a plurality of first semiconductor layers 110 of a first doping type and a plurality of second semiconductor layers 120 of a second doping type complementary to the first doping type, wherein the first semiconductor layers 110 and the second semiconductor layers 120 are arranged alternatingly between a first surface 101 and a second surface 102 of the layer stack.

The semiconductor device further comprises a first semiconductor region 13, 15 of a first semiconductor device M1 adjoining the plurality of first semiconductor layers 110. This first semiconductor region 13, 15 may either be a first source region 13 (source centered) or a first drain region 15 (drain centered). The first semiconductor region 13, 15 has a first end arranged in a first region A of the semiconductor device and extends from its first end and from the first region A in a first horizontal direction y into a second region B of the semiconductor device. The semiconductor device further comprises a plurality of second semiconductor regions (gate regions) 14 of the first semiconductor device M1, wherein each of the plurality of second semiconductor regions 14 adjoins at least one of the plurality of second semiconductor layers 120, and wherein a first number of the plurality of second semiconductor regions 14 is arranged in the first region A and a second number of the plurality of second semiconductor regions 14 is arranged in the second region B of the semiconductor device.

The semiconductor device further comprises a third semiconductor region 15, 13 of the first semiconductor device M1, adjoining the plurality of first semiconductor layers 110. This third semiconductor region 15, 13 may either be a first drain region 15 (source centered) or a first source region 13 (drain centered). The first semiconductor region 13, 15 extends from the first region A into the second region B of the semiconductor device and is spaced apart from the third semiconductor region 15, 13, and the plurality of second semiconductor regions 14 is arranged between the third semiconductor region 15, 13 and the first semiconductor region 13, 15, and is spaced apart from the third semiconductor region 15, 13 and the first semiconductor region 15, 13.

The semiconductor body 100 with the first and second semiconductor layers 110, 120 may be arranged on a carrier 200. This carrier 200 may be implemented in various different ways. One example of how the carrier 200 may be implemented is explained in the following.

Figure 17:
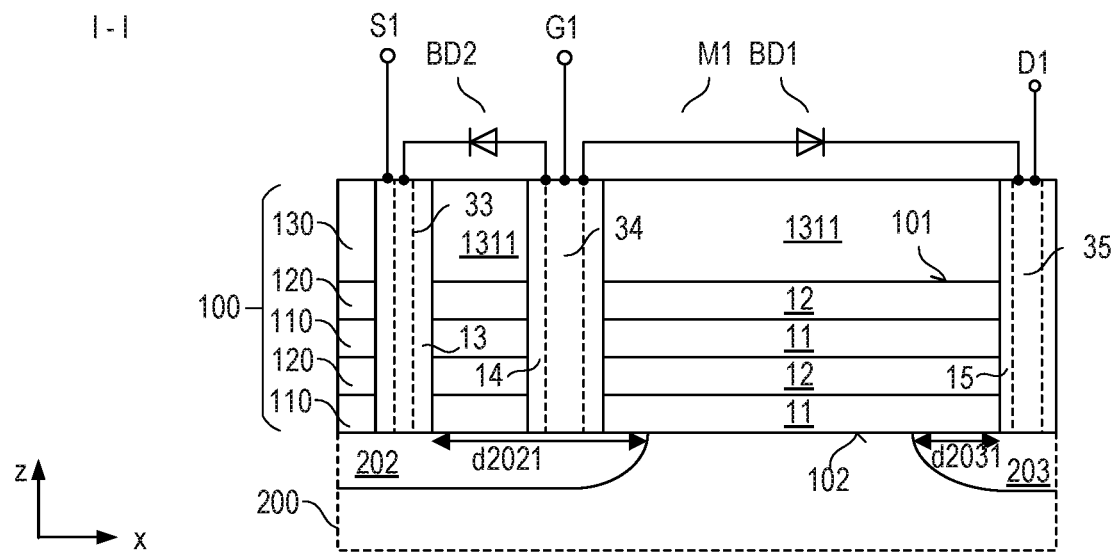
FIG. 17 shows a vertical cross-sectional view of a transistor arrangement according to one example.
Figure 18:
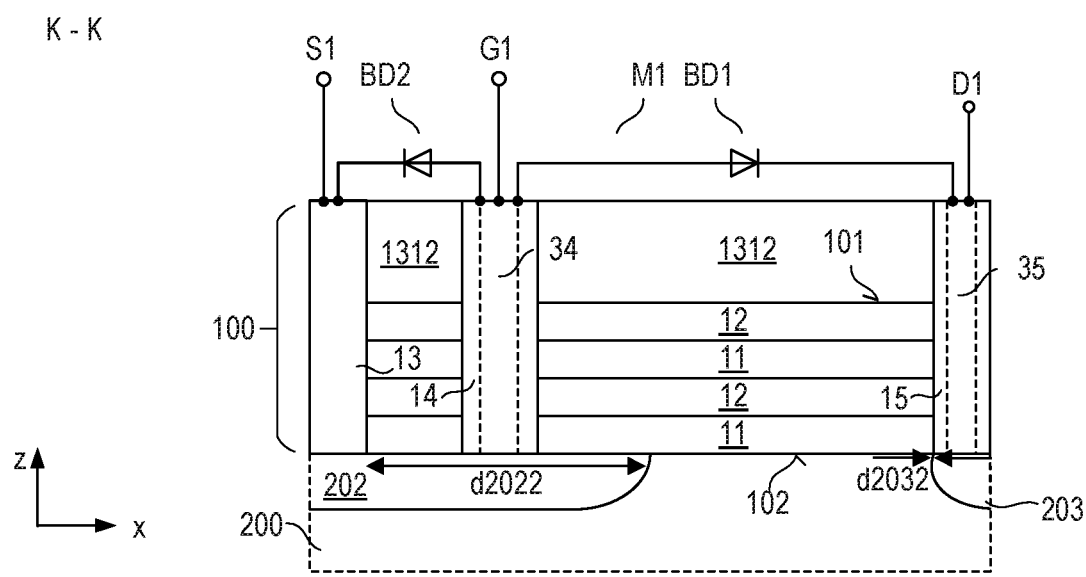
FIG. 18 shows a vertical cross-sectional view of a transistor arrangement according to one example.
Figure 19:
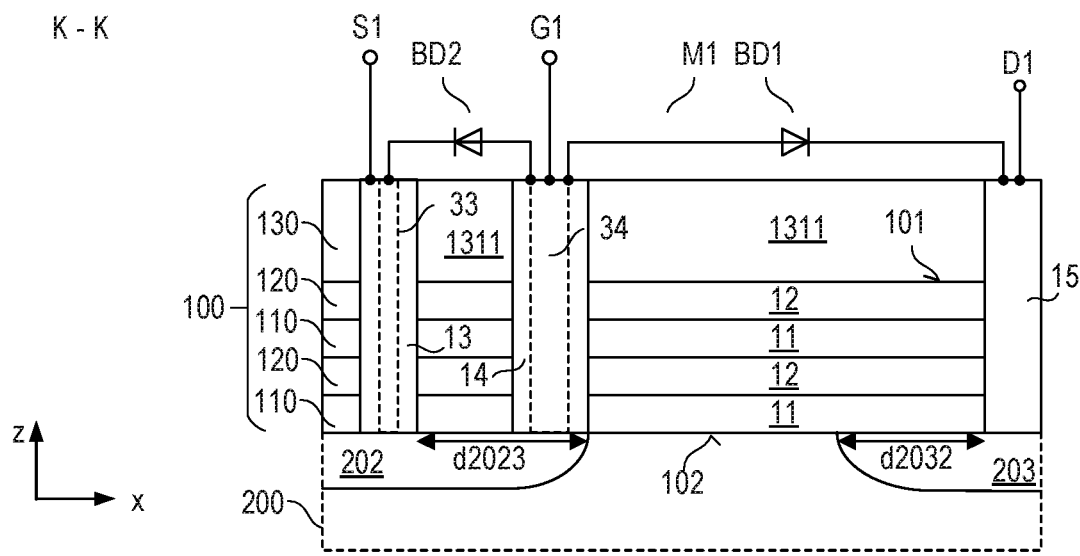
FIG. 19 shows a vertical cross-sectional view of a transistor arrangement according to one example.
Figure 20:
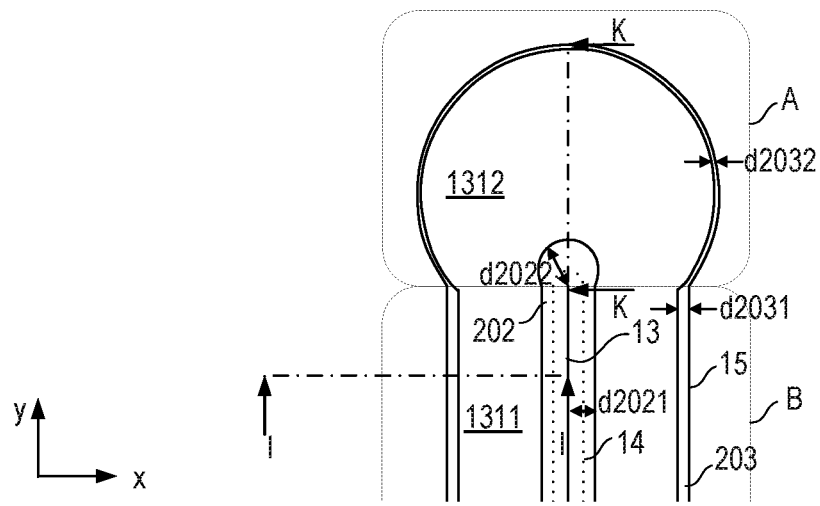
FIG. 20 shows a top view of a section of a transistor arrangement according to one example.

FIG. 17 shows an example of the carrier 200 in the second region B along a section plane I-I. The carrier 200 may be made of a semiconductor material. According to one example, the semiconductor material of the carrier 200 is the same semiconductor material as the semiconductor material of the semiconductor body 100 arranged on top of the carrier 200. The first drain region 15, the first source region 13, and the plurality of gate regions 14 may extend down to the carrier 200.

A first carrier region 202 of the second doping type is arranged in the carrier 200, extending from the second surface 102 of the layer stack into the carrier 200. The first carrier region 202 is arranged adjacent to the first source region 13 and the plurality of gate regions 14. A second carrier region 203 of the first doping type is arranged in the carrier 200, extending from the second surface 102 of the layer stack into the carrier 200. The second carrier region 203 is arranged adjacent to the first drain region 15. The first carrier region 202, in a horizontal direction, extends from the first source region 13 towards the first drain region 15.

In the first region A of the semiconductor device, a width d2022 of the first carrier region 202 is greater than a width d2021 of the first carrier region 202 in the second region B of the semiconductor device. This is schematically illustrated by means of FIGS. 17 (cross-sectional view along section plane I-I in the second region B, see FIG. 20) and 18 (cross-sectional view along section plane K-K in the first region, see FIG. 20). A width d2021, d2022 of the first carrier region 202 corresponds to an extension of the first carrier region 202 from the first source region 13 towards the first drain region 15. The width d2022 of the first carrier region 202 in the first region A of the semiconductor device may be between 20% and 40% of a distance between the first drain region 15 and the plurality of first gate regions 14 in the first region A, for example According to one example, the width d2022 of the first carrier region 202 in the first region A is between 3 μm and 30 μm.

In the first region A of the semiconductor device, a width d2032 of the second carrier region 203 may be less than a width d2031 of the second carrier region 203 in the second region B of the semiconductor device. This is schematically illustrated by means of FIGS. 17 (cross-sectional view along section plane I-I in the second region B, see FIG. 20) and 19 (cross-sectional view along section plane K-K in the first region, see FIG. 20). A width d2031, d2032 of the second carrier region 203 corresponds to an extension of the second carrier region 203 from the first drain region 15 towards the first source region 13.

The first carrier region 202 and the second carrier region 203 may be separate regions which do not directly adjoin each other. That is, a portion of the carrier 200 may always be arranged between the first carrier region 202 and the second carrier region 203 in a horizontal direction. In some embodiments, either the first carrier region 202 or the second carrier region 203 may also be omitted. That is, in some embodiments the semiconductor device may only comprise the first carrier region 202, and in other embodiments the semiconductor device may only comprise the second carrier region 203.

Figure 21:
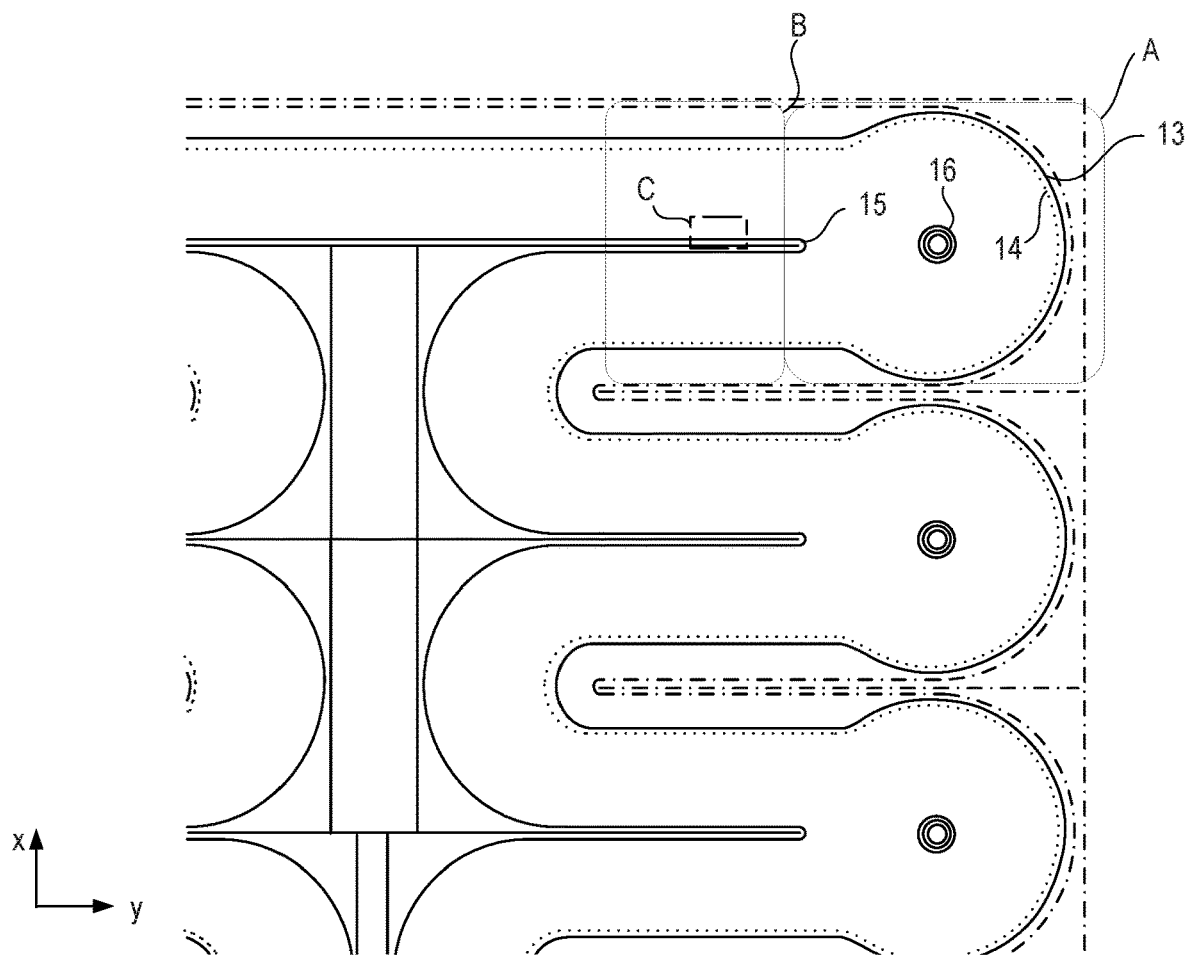
FIG. 21 shows a top view of a section of a transistor arrangement according to another example.

Now referring to FIG. 21, a top view of a section of a transistor arrangement according to one example is schematically illustrated. The arrangement illustrated in FIG. 21 comprises the comb-like arrangement that has already been described with respect to FIG. 16 above. In the example illustrated in FIG. 21, an average doping concentration along a shortest path between the first source region 13 and the first drain region 15 in either at least one of the first semiconductor layers 110, or in at least one of the second semiconductor layers 120, or in both may or may not be locally increased. In FIG. 21, only the essential elements of the semiconductor device are particularly designated with the respective reference numbers. In this example, each first drain region 15 in the second region B is formed by three parallel sub-regions.

Figure 22:
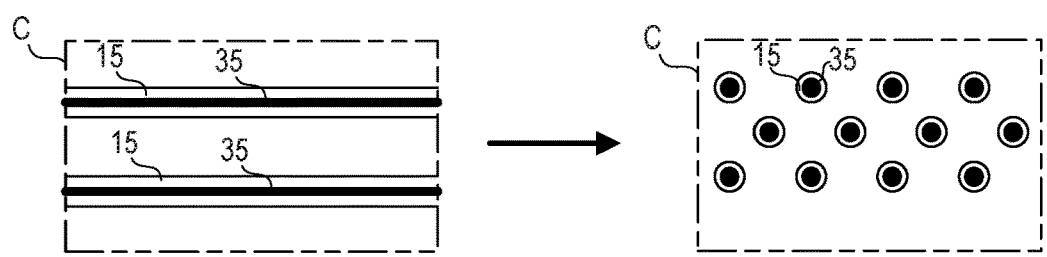
FIG. 22 shows a top view of a section of a first semiconductor region according to an example.

FIG. 22 (left side) exemplarily illustrates two parallel sub-regions of the first drain region 15 in a section C, as indicated in FIG. 21. According to one example, and as illustrated in FIG. 22 (right side), such parallel lane trenches may be replaced by a plurality of circular trenches. That is, the first drain region 15 or the first source region 13 or both may be implemented similar to the plurality of gate regions 14. However, while the plurality of gate regions 14 is arranged in a single row, as described above, a plurality of first drain regions 15 and/or a plurality of first source regions 13 each may be arranged in two or more parallel rows, as is exemplarily illustrated on the right side of FIG. 22.

Figure 23A:
Figure 23B:
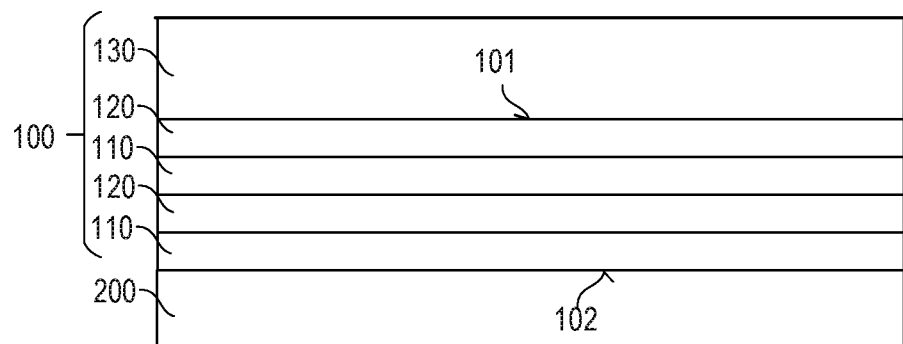
Figure 23C:
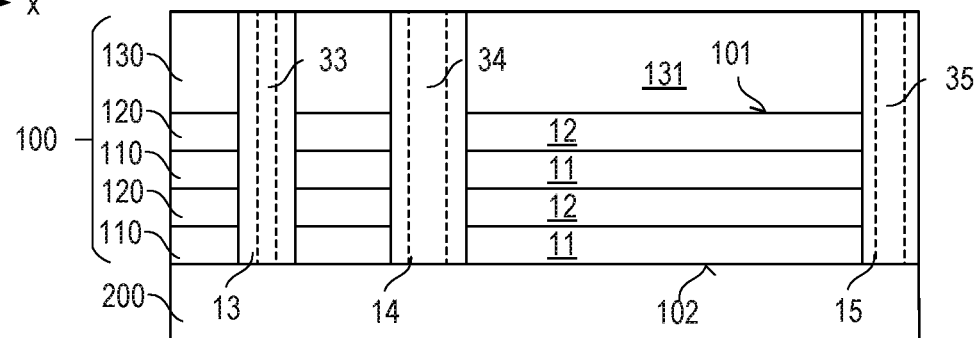

Now referring to FIGS. 23A-23D, a method for producing a semiconductor device is exemplarily illustrated. A carrier 200 may be provided (FIG. 23A). In a following step, a layer stack with a plurality of first semiconductor layers 110 of a first doping type and a plurality of second semiconductor layers 120 of a second doping type complementary to the first doping type may be formed on the carrier 200 (FIG. 23B). The first semiconductor layers 110 and the second semiconductor layers 120 are arranged alternatingly between a first surface 101 and a second surface 102 of the layer stack. Then, a first semiconductor region 13, 15 of a first semiconductor device M1 adjoining the plurality of first semiconductor layers 110 may be formed (see FIG. 23C), wherein the first semiconductor region 13, 15 has a first end arranged in a first region A of the semiconductor device and extends from its first end and from the first region A in a first horizontal direction y into a second region B of the semiconductor device. A plurality of second semiconductor regions 14 of the first semiconductor device M1 may also be formed (see FIG. 23C), wherein each of the plurality of semiconductor regions 14 adjoins at least one of the plurality of second semiconductor layers 120, and wherein a first number of the plurality of second semiconductor regions is arranged in the first region A and a second number of the plurality of second semiconductor regions 14 is arranged in the second region B of the semiconductor device. Further, a third semiconductor region 15, 13 of the first semiconductor device M1 may be formed (see FIG. 23C), adjoining the plurality of first semiconductor layers 110, wherein the first semiconductor region 13, 15 extends from the first region A into the second region B of the semiconductor device and is spaced apart from the third semiconductor region 15, 13, and the plurality of second semiconductor regions 14 is arranged between the third semiconductor region 15, 13 and the first semiconductor region 13, 15, and is spaced apart from the third semiconductor region 15, 13 and the first semiconductor region 15.

According to one example, an average doping concentration along a shortest path between the first semiconductor region 13, 15 and the third semiconductor region 15, 13 in either at least one of the first semiconductor layers 110, or in at least one of the second semiconductor layers 120 or both in the first region A differs from an average doping concentration along a shortest path between the first semiconductor region 13, 15 and the third semiconductor region 15, 13 of the same layer 110, 120 in the second region B.

Figure 23D:
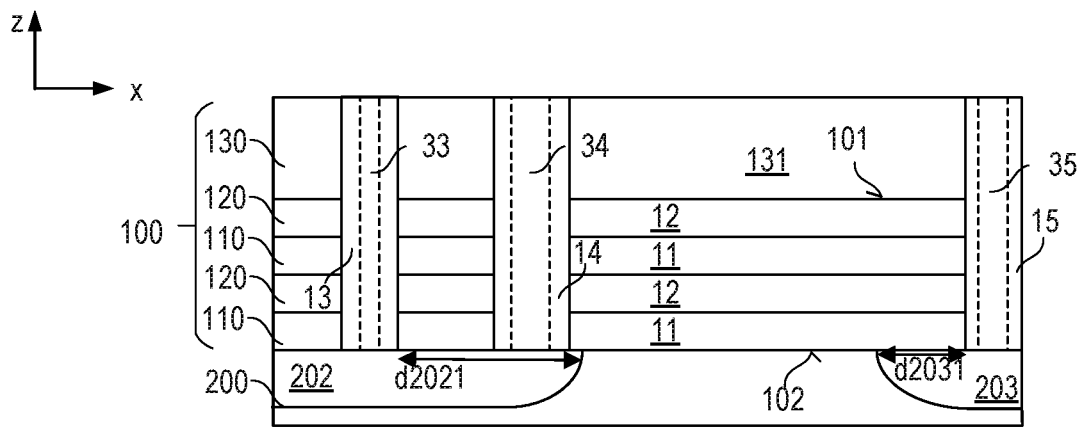

Alternatively or additionally, a first carrier region 202, a second carrier region 203, or both may be formed in the carrier 200 (see FIG. 23D). The widths d2021, d2022, d2031, d2032 of the first carrier region 202 and the second carrier region 203 may be chosen as has been described with respect to FIGS. 17 to 20 above.

Figure 24:
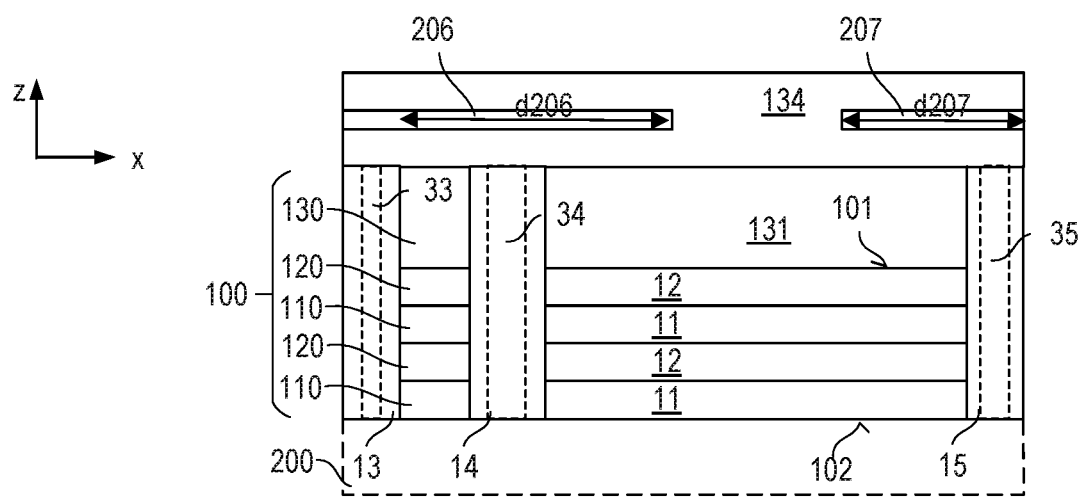
FIG. 24 shows a vertical cross-sectional view of a transistor arrangement according to one example.

Now referring to FIG. 24, it is further possible, in addition to or instead of the different features that may be implemented to increase the breakdown voltage above, to form a first field plate region 206 or a second field plate region 207 or both on the third semiconductor layer 130. The widths d206, d207 of such field plate regions 206, 207 may be similar to what has been described with respect to the first carrier region 202 and the second carrier region 203 above. That is, a width d206 of the first field plate region 206 in the first region A may differ from a width d206 of the first field plate region 206 in the second region B. A width d207 of the second field plate region 207 in the first region A may differ from a width d207 of the second field plate region 207 in the second region B. The first field plate region 206 may be arranged above the first source region 13 end extend in a horizontal direction towards the first drain region 15. The second field plate electrode 207 may be arranged above the first drain region 15 and extend in a vertical direction towards the first source region 13. The first field plate electrode 206 and the second field plate electrode 207 may not directly adjoin each other. According to one example, a layer of electrically insulating material 134 may be formed on the third semiconductor layer 130 such that the third semiconductor layer 130 is arranged between the layer of electrically insulating material 134 and the layer stack. The first field plate electrode 206 and the second field plate electrode 207 may be arranged in the layer of electrically insulating material 134 and may be electrically insulated from each other.

The first field plate region 206 and the second field plate region 207 may either be floating field plate regions not being in electrical contact with any of the elements of the first semiconductor device M1. According to another example, the first field plate region 206 and the second field plate region 207 may be in electrical contact with one or more elements of the first semiconductor device M1 (not specifically illustrated). The first field plate region 206 and the second field plate region 207 may comprise a conducting material such as a metal, a polysilicon, or a doped semiconductor material, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a layer stack with a plurality of first semiconductor layers of a first doping type and a plurality of second semiconductor layers of a second doping type complementary to the first doping type, wherein the first semiconductor layers and the second semiconductor layers are arranged alternatingly between a first surface and a second surface of the layer stack;
   a first semiconductor region of a first semiconductor device adjoining the plurality of first semiconductor layers, wherein the first semiconductor region has a first end arranged in a first region of the first semiconductor device and extends from the first end and from the first region in a first horizontal direction into a second region of the first semiconductor device;
   a plurality of second semiconductor regions of the first semiconductor device, wherein each of the plurality of second semiconductor regions adjoins at least one of the plurality of second semiconductor layers, and wherein a first number of the plurality of second semiconductor regions is arranged in the first region and a second number of the plurality of second semiconductor regions is arranged in the second region of the first semiconductor device; and
   a third semiconductor region of the first semiconductor device, adjoining the plurality of first semiconductor layers,
   wherein the third semiconductor region extends from the first region into the second region of the first semiconductor device and is spaced apart from the first semiconductor region,
   wherein the plurality of second semiconductor regions is arranged between the third semiconductor region and the first semiconductor region, and is spaced apart from the third semiconductor region and the first semiconductor region,
   wherein an average doping concentration along a shortest path between the first semiconductor region and the third semiconductor region in at least one of the plurality of first semiconductor layers and in at least one of the plurality of second semiconductor layers in the first region differs from an average doping concentration along a shortest path between the first semiconductor region and the third semiconductor region of the same layer in the second region.

2. The semiconductor device of claim 1, wherein the plurality of second semiconductor regions and the third semiconductor region extend along the first semiconductor region in the second region of the first semiconductor device, and wherein the plurality of second semiconductor regions and the third semiconductor region extend around the first semiconductor region in the first region of the first semiconductor device, thereby forming an arc around the first end of the first semiconductor region and surrounding the first end of the first semiconductor region horizontally.

3. The semiconductor device of claim 1, wherein a distance between the plurality of second semiconductor regions and the first semiconductor region is greater than a distance between the plurality of second semiconductor regions and the third semiconductor region, and an average concentration of doping atoms of the second doping type along a shortest path between the first semiconductor region and the third semiconductor region in at least one of the plurality of first semiconductor layers or in at least one of the plurality of second semiconductor layers is lower in the first region than in the same layer in the second region of the first semiconductor device.

4. The semiconductor device of claim 3, wherein in the at least one of the first semiconductor layers or in the at least one of the second semiconductor layers, the concentration of dopant atoms of the second type along a shortest path between the first semiconductor region and the third semiconductor region in the first region is between 10% and 30% lower than the concentration of dopant atoms of the second type in the same layer in the second region of the first semiconductor device.

5. The semiconductor device of claim 1, wherein a distance between the plurality of second semiconductor regions and the first semiconductor region is less than a distance between the plurality of second semiconductor regions and the third semiconductor region, and wherein an average concentration of doping atoms of the first doping type along a shortest path between the first semiconductor region and the third semiconductor region in at least one of the plurality of first semiconductor layers or in at least one of plurality of the second semiconductor layers is higher in the first region than in the same layer in the second region of the first semiconductor device.

6. The semiconductor device of claim 5, wherein in the at least one of the first semiconductor layers or in the at least one of the second semiconductor layers, the average concentration of dopant atoms of the first type along a shortest path between the first semiconductor region and the third semiconductor region in the first region is between 10% and 30% higher than the concentration of dopant atoms of the first type in the same layer in the second region of the first semiconductor device.

7. The semiconductor device of claim 1, wherein a distance between the first semiconductor region and the third semiconductor region in the first region is greater than a distance between the first semiconductor region and the third semiconductor region in the second region.

8. The semiconductor device of claim 1, further comprising a carrier, wherein the second surface of the layer stack adjoins the carrier, and wherein the first semiconductor device further comprises at least one of:
a first carrier region of the second doping type, extending from the second surface of the layer stack into the carrier, wherein the first carrier region is arranged adjacent to the first semiconductor region and the plurality of second semiconductor regions; and
a second carrier region of the first doping type, extending from the second surface of the layer stack into the carrier, wherein the second carrier region is arranged adjacent to the third semiconductor region.

9. The semiconductor device of claim 8, wherein the first carrier region, in a horizontal direction, extends from the first semiconductor region towards the third semiconductor region.

10. The semiconductor device of claim 9, wherein in the first region of the first semiconductor device, a width of the first carrier region is greater than a width of the first carrier region in the second region of the first semiconductor device, and wherein a width of the first carrier region corresponds to an extension of the first carrier region from the first semiconductor region towards the third semiconductor region.

11. The semiconductor device of claim 1, wherein the doping concentration along the shortest path between the first semiconductor region and the third semiconductor region is homogenous.

12. The semiconductor device of claim 1, wherein the doping concentration is different for different sections along the shortest path between the first semiconductor region and the third semiconductor region.

13. A semiconductor device, comprising:
a layer stack with a plurality of first semiconductor layers of a first doping type and a plurality of second semiconductor layers of a second doping type complementary to the first doping type, wherein the first semiconductor layers and the second semiconductor layers are arranged alternatingly between a first surface and a second surface of the layer stack;
a first semiconductor region of a first semiconductor device adjoining the plurality of first semiconductor layers, wherein the first semiconductor region has a first end arranged in a first region of the first semiconductor device and extends from the first end and from the first region in a first horizontal direction into a second region of the first semiconductor device;
a plurality of second semiconductor regions of the first semiconductor device, wherein each of the plurality of second semiconductor regions adjoins at least one of the plurality of second semiconductor layers, and wherein a first number of the plurality of second semiconductor regions is arranged in the first region and a second number of the plurality of second semiconductor regions is arranged in the second region of the first semiconductor device;
a third semiconductor region of the first semiconductor device, adjoining the plurality of first semiconductor layers,
wherein the third semiconductor region extends from the first region into the second region of the first semiconductor device and is spaced apart from the first semiconductor region, and the plurality of second semiconductor regions is arranged between the third semiconductor region and the first semiconductor region, and is spaced apart from the third semiconductor region and the first semiconductor region;
a carrier, wherein the second surface of the layer stack adjoins the carrier; and
at least one of a first carrier region and a second carrier region, the first carrier region of the second doping type, extending from the second surface of the layer stack into the carrier, wherein the first carrier region is arranged adjacent to the first semiconductor region and the plurality of second semiconductor regions, and the second carrier region of the first doping type, extending from the second surface of the layer stack into the carrier, wherein the second carrier region is arranged adjacent to the third semiconductor region, wherein the first carrier region, in a second horizontal direction, extends from the first semiconductor region towards the third semiconductor region, wherein in the first region of the first semiconductor device, a width of the first carrier region differs from a width of the first carrier region in the second region of the first semiconductor device, wherein a width of the first carrier region corresponds to an extension of the first carrier region from the first semiconductor region towards the third semiconductor region.

14. A semiconductor device, comprising:

a layer stack with a plurality of first semiconductor layers of a first doping type and a plurality of second semiconductor layers of a second doping type complementary to the first doping type, wherein the first semiconductor layers and the second semiconductor layers are arranged alternatingly between a first surface and a second surface of the layer stack;

a first semiconductor region of a first semiconductor device adjoining the plurality of first semiconductor layers, wherein the first semiconductor region has a first end arranged in a first region of the first semiconductor device and extends from the first end and from the first region in a first horizontal direction into a second region of the first semiconductor device;

a plurality of second semiconductor regions of the first semiconductor device, wherein each of the plurality of second semiconductor regions adjoins at least one of the plurality of second semiconductor layers, and wherein a first number of the plurality of second semiconductor regions is arranged in the first region and a second number of the plurality of second semiconductor regions is arranged in the second region of the first semiconductor device;

a third semiconductor region of the first semiconductor device, adjoining the plurality of first semiconductor layers, wherein the first semiconductor region extends from the third region into the second region of the first semiconductor device and is spaced apart from the first semiconductor region, and the plurality of second semiconductor regions is arranged between the third semiconductor region and the first semiconductor region, and is spaced apart from the third semiconductor region and the first semiconductor region;

a third semiconductor layer, wherein the first surface of the layer stack adjoins the third semiconductor layer; and at least one of a first field plate electrode and a second field plate electrode, comprising:

the first field plate electrode comprising a conducting material, arranged adjacent to the third semiconductor layer such that the third semiconductor layer is arranged between the first field plate electrode and the layer stack; and the second field plate electrode comprising a conducting material, arranged adjacent to the third semiconductor layer such that the third semiconductor layer is arranged between the second field plate electrode and the layer stack, wherein the first field plate electrode, in a second horizontal direction, extends from the first semiconductor region towards the third semiconductor region, wherein in the first region of the first semiconductor device, a width of the first field plate electrode differs from a width of the first field plate electrode in the second region of the first semiconductor device, wherein a width of the first field plate electrode corresponds to an extension of the first field plate electrode from the first semiconductor region towards the third semiconductor region.

15. A semiconductor device, comprising:

a layer stack with a plurality of first semiconductor layers of a first doping type and a plurality of second semiconductor layers of a second doping type complementary to the first doping type, wherein the first semiconductor layers and the second semiconductor layers are arranged alternatingly between a first surface and a second surface of the layer stack;

a first semiconductor region of a first semiconductor device adjoining the plurality of first semiconductor layers, wherein the first semiconductor region has a first end arranged in a first region of the first semiconductor device and extends from the first end and from the first region in a first horizontal direction into a second region of the first semiconductor device;

a plurality of second semiconductor regions of the first semiconductor device, wherein each of the plurality of second semiconductor regions adjoins at least one of the plurality of second semiconductor layers, and wherein a first number of the plurality of second semiconductor regions is arranged in the first region and a second number of the plurality of second semiconductor regions is arranged in the second region of the first semiconductor device; and a third semiconductor region of the first semiconductor device, adjoining the plurality of first semiconductor layers, wherein the third semiconductor region extends from the first region into the second region of the first semiconductor device and is spaced apart from the first semiconductor region, wherein the plurality of second semiconductor regions is arranged between the third semiconductor region and the first semiconductor region, and is spaced apart from the third semiconductor region and the first semiconductor region, wherein an average doping concentration along a shortest path between the first semiconductor region and the third semiconductor region in at least one of the plurality of first semiconductor layers and in at least one of the plurality of second semiconductor layers in the first region differs from an average doping concentration along a shortest path between the first semiconductor region and the third semiconductor region of the same layer in the second region, wherein the difference in average doping concentration between the first and second region results from a section of the semiconductor body that is spaced apart from the first semiconductor region by the first and second semiconductor layers from the layer stack, has a locally increased dopant concentration as the first and second semiconductor layers from the layer stack, and has an increased width in the second region than in the first region.

* * * * *